(12) United States Patent
Tilleman

(10) Patent No.: US 9,798,126 B2
(45) Date of Patent: Oct. 24, 2017

(54) MODULAR ILLUMINATOR FOR EXTREMELY WIDE FIELD OF VIEW

(71) Applicant: Rockwell Automation Technologies, Inc., Mayfield Heights, OH (US)

(72) Inventor: Michael M. Tilleman, Brookline, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 111 days.

(21) Appl. No.: 14/993,601

(22) Filed: Jan. 12, 2016

(65) Prior Publication Data

US 2017/0059838 A1    Mar. 2, 2017

Related U.S. Application Data

(60) Provisional application No. 62/209,708, filed on Aug. 25, 2015.

(51) Int. Cl.
*G02B 19/00* (2006.01)
*G02B 27/10* (2006.01)
(Continued)

(52) U.S. Cl.
CPC .......... *G02B 19/0028* (2013.01); *F21V 5/007* (2013.01); *F21V 5/008* (2013.01);
(Continued)

(58) Field of Classification Search
CPC ............ G02B 19/0028; G02B 19/0047; G02B 19/0057; G02B 19/0066; G02B 27/0905;
(Continued)

(56) References Cited

U.S. PATENT DOCUMENTS 5,612,821 A    3/1997  Schmutz
6,433,934 B1   8/2002  Reznichenko et al.
(Continued)

OTHER PUBLICATIONS

European Search Report for European Patent Application No. 16182180.6-1562 dated Feb. 10, 2017, 7 pages.
(Continued)

*Primary Examiner* — Loha Ben
(74) *Attorney, Agent, or Firm* — Amin, Turocy & Watson, LLP

(57) ABSTRACT

A modular illumination system is capable of producing a light beam having a wide field of view—e.g., in excess of ninety degrees—while maintaining a high collection efficiency as well as a high degree of beam homogeneity. The illumination system comprises an elementary unit having a linear array of light sources. Light from the light sources is collimated using a corresponding array of catadioptric lenses, and the collimated light is homogenized in the tangential plane using two cylindrical lens arrays set in tandem to one another. The homogenized light is then collimated in the sagittal plane using a cylindrical lens that is set perpendicular to the lenses of the two cylindrical lens arrays to yield a wide linear beam. To produce an area beam, the linear array of light sources can be replaced with a two-dimensional array, and the cylindrical lenses can be replaced with spherical lenses.

20 Claims, 20 Drawing Sheets

(51) Int. Cl.
*G02B 27/09* (2006.01)
*F21V 5/04* (2006.01)
*G02B 27/30* (2006.01)
*F21V 5/00* (2015.01)
*G01S 17/08* (2006.01)
*G01S 17/89* (2006.01)
*H01L 33/58* (2010.01)
*G01S 7/481* (2006.01)
*F21Y 115/30* (2016.01)
*F21Y 115/10* (2016.01)

(52) U.S. Cl.
CPC .............. *F21V 5/041* (2013.01); *F21V 5/043* (2013.01); *G01S 7/4815* (2013.01); *G01S 7/4817* (2013.01); *G01S 17/08* (2013.01); *G01S 17/89* (2013.01); *G02B 19/0047* (2013.01); *G02B 19/0057* (2013.01); *G02B 19/0066* (2013.01); *G02B 27/0905* (2013.01); *G02B 27/0961* (2013.01); *G02B 27/0966* (2013.01); *G02B 27/30* (2013.01); *H01L 33/58* (2013.01); *F21V 5/045* (2013.01); *F21Y 2115/10* (2016.08); *F21Y 2115/30* (2016.08)

(58) Field of Classification Search
CPC ........................ G02B 27/0961; G02B 27/0966; G02B 27/30; H01L 33/58; F21V 5/002; F21V 5/007; F21V 5/008; F21V 5/041; F21V 5/043; F21V 5/045; F21Y 2115/10; F21Y 2115/30; G03B 21/602; G01S 7/4815; G01S 7/4817; G01S 17/08; G01S 17/89
USPC ....... 359/364, 434, 455, 599, 621–624, 626, 359/641, 733; 353/28, 32; 355/53, 67, 355/69; 362/555
See application file for complete search history.

(56) References Cited

U.S. PATENT DOCUMENTS

| | | | | |
|---|---|---|---|---|
| 6,583,937 | B1* | 6/2003 | Wangler | G02B 13/143 355/53 |
| 6,611,382 | B2* | 8/2003 | Hashimoto | G02B 27/0961 359/619 |
| 6,830,189 | B2 | 12/2004 | Tsikos et al. | |
| 7,159,986 | B2* | 1/2007 | Bremer | G03B 21/26 348/801 |
| 7,268,950 | B2* | 9/2007 | Poulsen | B29D 11/00278 359/619 |
| 7,619,824 | B2* | 11/2009 | Poulsen | G03B 21/60 359/455 |
| 8,390,914 | B2* | 3/2013 | Woodgate | F21V 14/003 359/245 |
| 9,360,762 | B2* | 6/2016 | Tychkov | G03F 7/70116 |
| 2002/0024740 | A1 | 2/2002 | Hashimoto | |
| 2005/0237488 | A1 | 10/2005 | Yamasaki | |
| 2010/0283842 | A1 | 11/2010 | Guissin et al. | |
| 2012/0057345 | A1 | 3/2012 | Kuchibhotla | |
| 2013/0050405 | A1 | 2/2013 | Masuda et al. | |
| 2015/0002664 | A1 | 1/2015 | Eppinger et al. | |

OTHER PUBLICATIONS

European Search Report for European Patent Application No. 16182177.2-1562 dated Feb. 2, 2017, 10 pages.
Extended European Search Report for European Patent Application No. 16182180.6-1562 dated May 23, 2017, 16 pages.
Office Action for U.S. Appl. No. 14/993,601, dated Jun. 16, 2017, 20 pages.

* cited by examiner

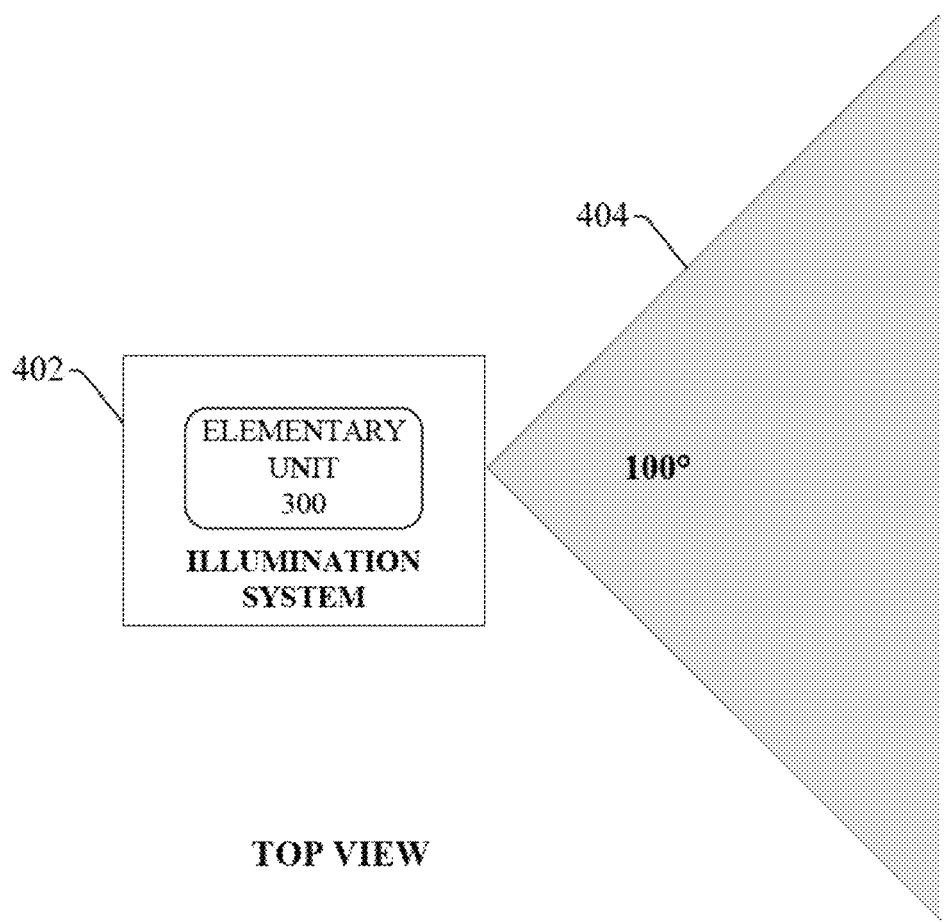
TOP VIEW
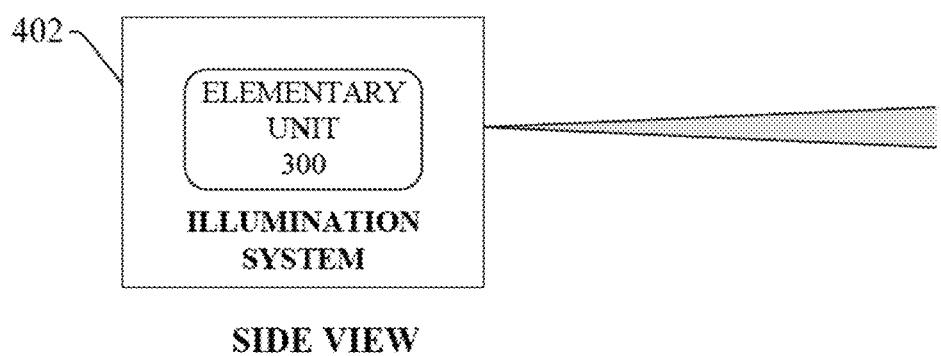
SIDE VIEW
FIG. 4

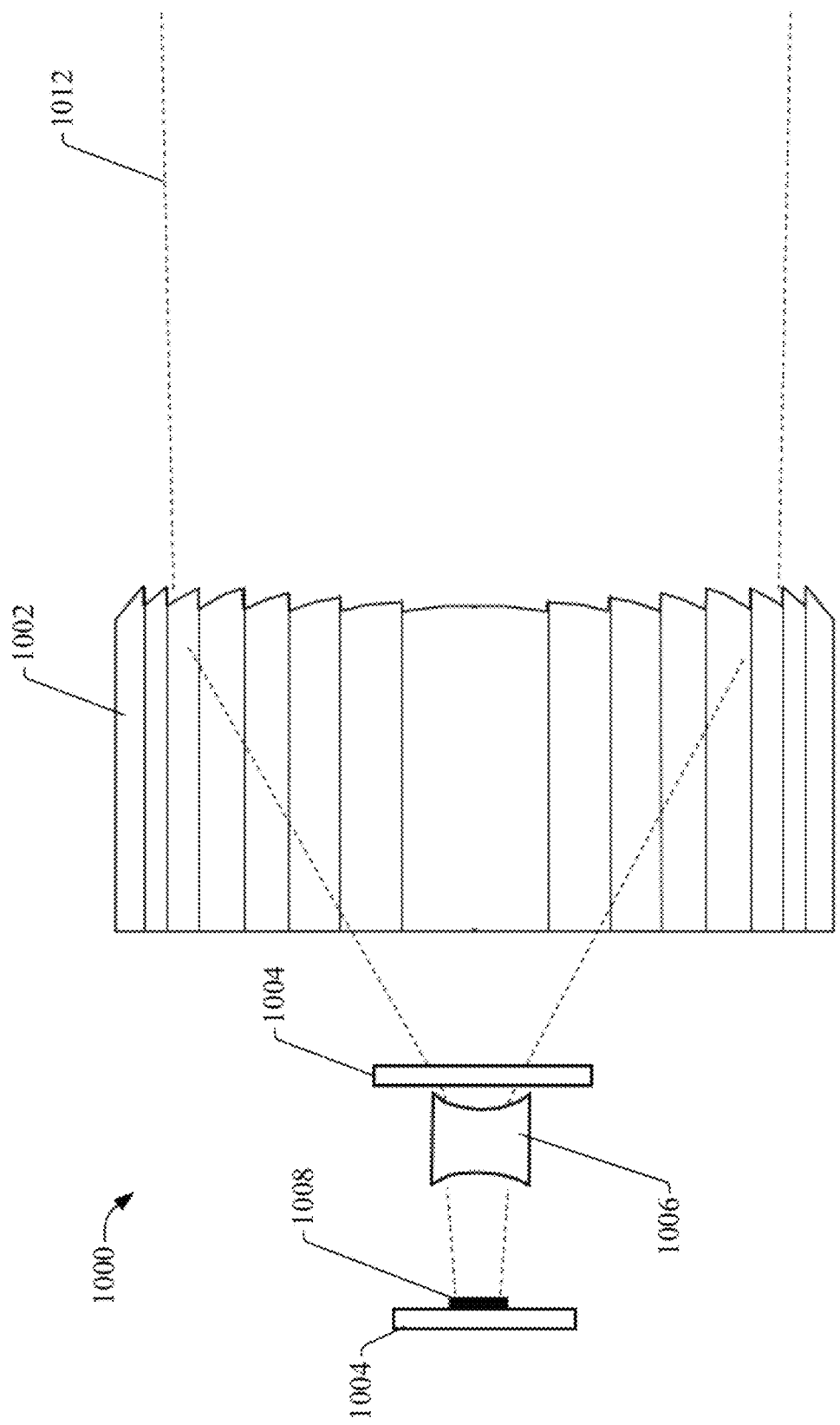

MODULAR ILLUMINATOR FOR EXTREMELY WIDE FIELD OF VIEW

CROSS-REFERENCE TO RELATED APPLICATIONS

This application claims priority to U.S. Provisional Application Ser. No. 62/209,708, filed on Aug. 25, 2015, and entitled "MODULAR ILLUMINATOR FOR EXTREMELY WIDE FIELD OF VIEW," the entirety of which is incorporated herein by reference.

BACKGROUND

The subject matter disclosed herein relates generally to illumination of a viewing area for optical imaging systems, and, more particularly, to an illumination system capable of producing a wide beam in excess of ninety degrees and having a high degree of homogeneity

BRIEF DESCRIPTION

The following presents a simplified summary in order to provide a basic understanding of some aspects described herein. This summary is not an extensive overview nor is it intended to identify key/critical elements or to delineate the scope of the various aspects described herein. Its sole purpose is to present some concepts in a simplified form as a prelude to the more detailed description that is presented later.

In one or more embodiments, an illumination system is provided comprising an array of light sources; one or more catadioptric lenses arranged to collect light from the array of light sources; a first array of lenses arranged in a first row that is substantially perpendicular to an optical path of light from the one or more catadioptric lenses; a second array of lenses arranged in a second row that is substantially parallel to the first row and substantially perpendicular to the optical path; and an output lens arranged to collect light from the second array of lenses.

Also, one or more embodiments provide a method for producing a beam of light, comprising generating light by a linear array of light sources; collimating the light by one or more catadioptric lenses to yield first collimated light; homogenizing the first collimated light in a tangential plane by two cylindrical lens arrays set in tandem to one another to yield homogenized light; and collimating the homogenized light in a sagittal plane by a cylindrical lens set perpendicular to the two cylindrical lens arrays to yield second collimated light.

Also, one or more embodiments provide a method for producing a beam of light, comprising generating light by a two-dimensional array of light sources; collimating the light by one or more catadioptric lenses to yield first collimated light; homogenizing the first collimated light in a tangential plane by two spherical lens arrays set in tandem to one another to yield homogenized light; and collimating the homogenized light in a the tangential plane and a sagittal plane by a spherical lens.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 4 is a top view and a side view of a beam projected by an illumination system comprising a modular elementary unit illuminating a field of view of 95 degrees.

FIG. 10C is a side view of an elementary unit for an example illumination system that uses VCSELs as the light sources.

DETAILED DESCRIPTION

Figure 1:
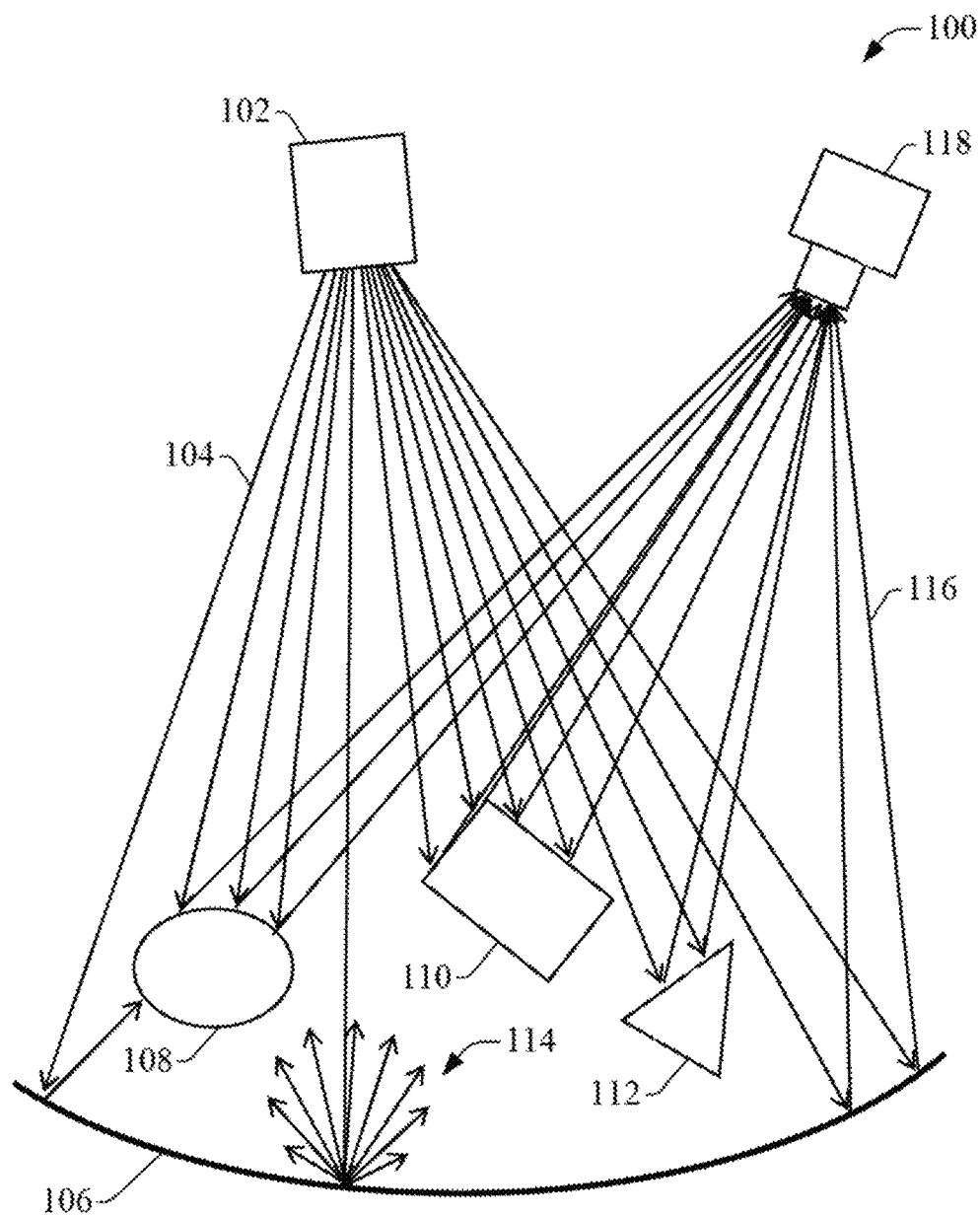
FIG. 1 is a diagram illustrating capture of an image by an example, non-limiting illumination and imaging system, which comprises an illuminator and an imaging system.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Also, the term "VCSEL" which is an abbreviation for "Vertical Cavity Surface Emitting Laser" is used for arrays of VCSELs. State-of-the-art VCSEL arrays contain ten thousands of individual VCSELs.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Illumination systems are often used in conjunction with cameras or other types of imaging systems in order to properly illuminate areas in which ambient light is insufficient to allow the camera to produce an image with a desired contrast and signal-to-noise ratio. FIG. 1 is a diagram illustrating capture of an image by an example, non-limiting illumination and imaging system 100, which comprises an illuminator 102 and an imaging system 118. Illuminator 102 emits light 104 into a viewing area to be imaged. Portions of the emitted light that are incident on solid objects and surfaces within the field of view—such as solid bodies 108, 110, and 112 and wall 106—are scattered by the illuminated objects and surfaces as scattered rays 114. Subsets of the scattered rays 116 are received and collected by the imaging system 118, and image capturing components within the imaging system 118 (e.g., a photodiode array, a charged-coupled device, a complimentary metal-oxide semiconductor, photographic film or emulsion, etc.) record the rays 116 reflected from the objects and surfaces as an image (or as a set of point cloud data in the case of three-dimensional imaging systems).

Illuminator 102 and imaging system 118 can be, for example, components of a commercial camera or a more specialized camera such as a multi-spectral or hyper-spectral imaging camera. Imaging system 100 may also be components of a time-of-flight (TOF) camera (also known as a three-dimensional image sensor) capable of generating distance information for points within the viewing field.

Illumination systems (such as illuminator 102) are typically designed to suit the requirements of a particular type of camera or imaging system. For example, commercial cameras are equipped with a relatively simple flash illuminator to compensate for a deficit of ambient light under dark conditions. Multi-spectral and hyper-spectral imaging systems employ more specialized cameras designed to capture image information at specific electromagnetic frequencies, and therefore use illumination systems that generate light customized for the specific spectral ranges required. With the advent of solid-state illumination sources, such as lasers, VCSELs, and light-emitting diodes (LEDs), which are capable of emitting light at narrow spectral bands, illumination systems are capable of illuminating a viewing space with light directed to specific defined wavelengths. Designers of illumination systems often seek to provide illumination across the spectral ranges required by the imaging application while minimizing the effects of background radiation using compatible bandpass filters.

Figure 2:
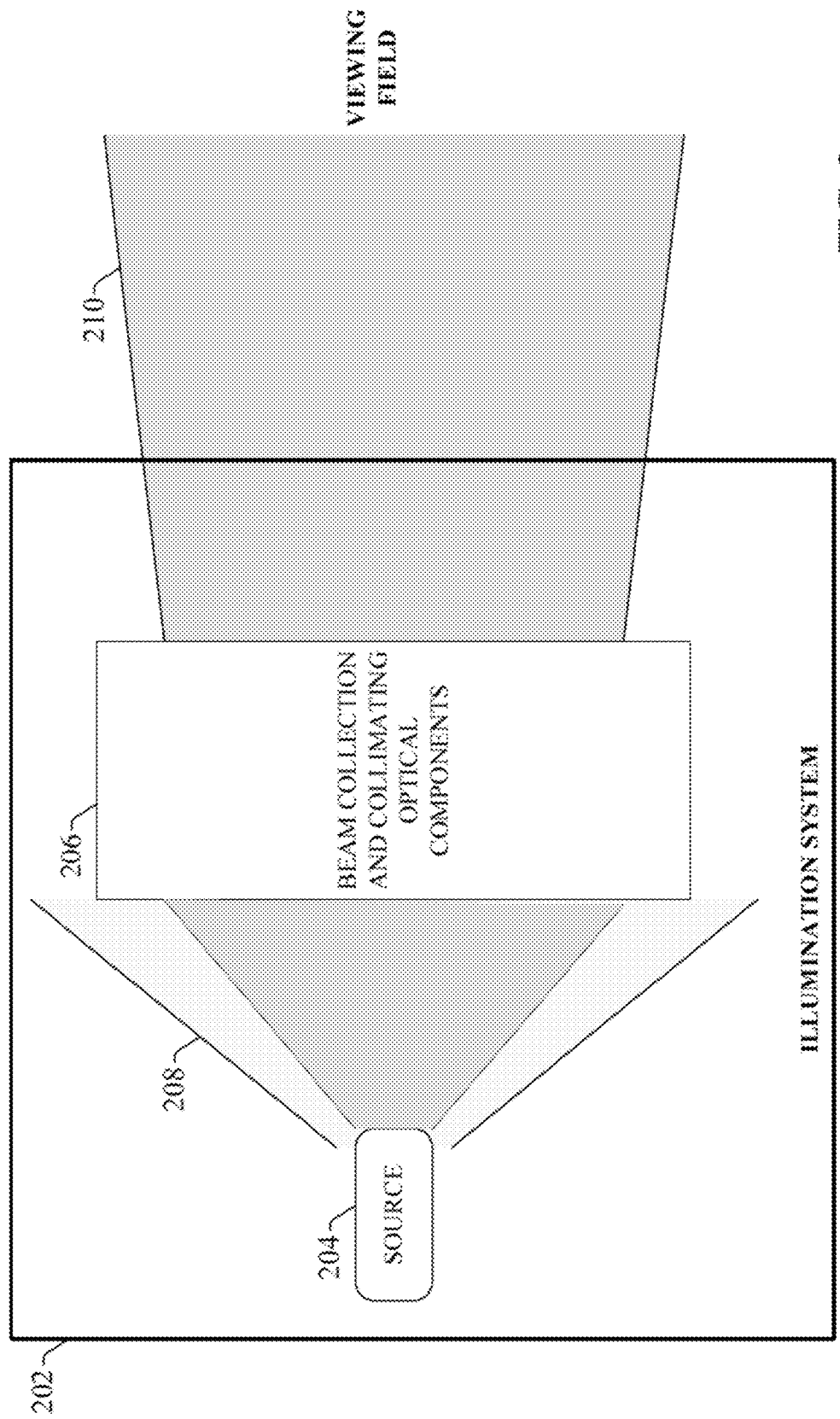
FIG. 2 is a diagram of an example illumination system.

FIG. 2 is a diagram of an example illumination system 202. A given illumination system 202 can comprise a light source 204—e.g., an LED, a laser (e.g., a vertical-cavity surface-emitting laser, or VCSEL), or other type of source—that generates and emits light 208, and optical components 206 that collect, collimate, and direct the light from the source 204 to the viewing field as a processed beam 210. The delivery efficiency of a given illumination system—that is, the percentage of light generated by the source 204 that is ultimately delivered to the viewing field—can be described as the product of the collection efficiency and the transmission efficiency of the system. In general, the collection efficiency describes the percentage of light 208 emitted by the source 204 that is collected by the optical components 206 (e.g., by a collection lens) for further optical processing and transmission. The transmission efficiency describes the percentage of the collected light that is conserved during transmission of the collected light through the optical path of the optical components 206; that is, the percentage of collected light that is not lost through vignetting, reflection, scattering, or absorption during transmission through the illumination system. The delivery efficiency is also at least partially a function of the &endue of the source 204 (or its Lagrange invariant), which is a product of the area of the source 204 and the solid angle at which the source projects its light beam.

One or more embodiments of the present disclosure provide a modular illumination system that can illuminate a wide field of view (e.g., in excess of 90 degrees) while maintaining a high collection efficiency and transmission, as well as a high degree of homogeneity (e.g., in excess of 80%), across the beam's irradiance profile. The high collection efficiency also yields a corresponding high delivery efficiency. The elementary unit of the illumination system can comprise a solid-state radiant source—such as an array of LEDs, VCSELs, or lasers—and a number of powered element that cast light from the source to the field of view with a high collection efficiency. Any illuminated area features are limited by the source étendue, or the Lagrange invariant thereof.

Figure 3:
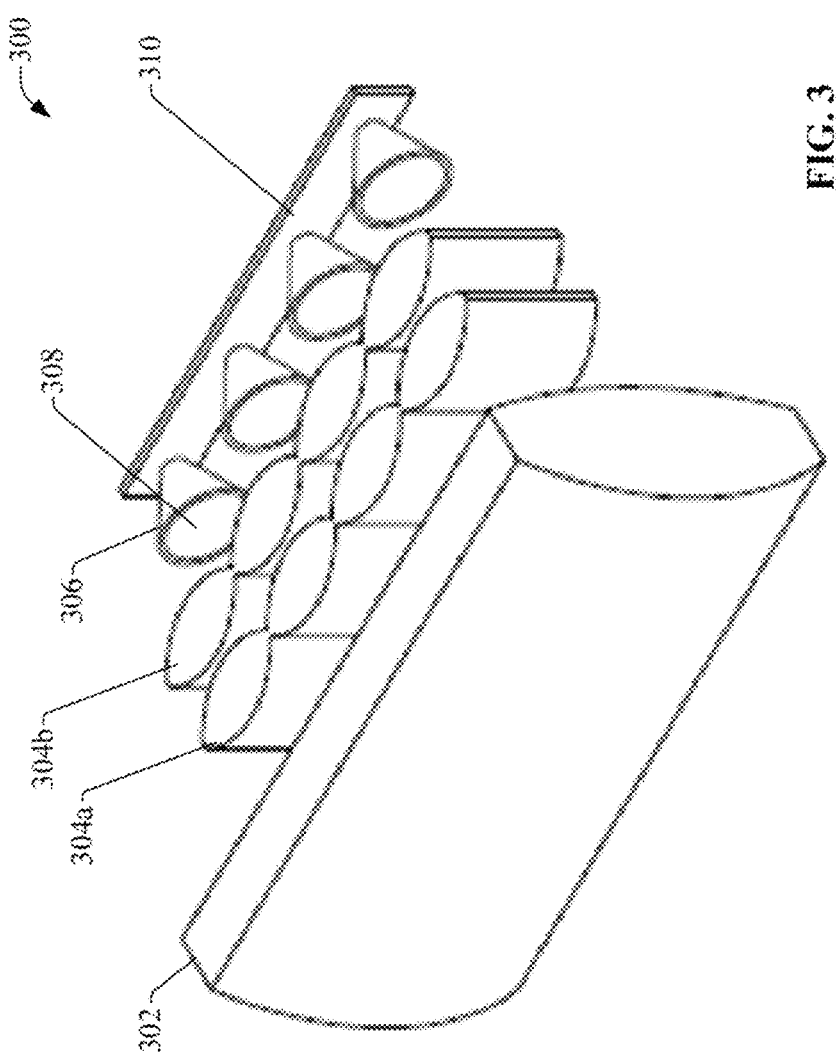
FIG. 3 is a three-dimensional view of an elementary unit for an example illumination system that uses surface-emitting LEDs as the light sources.

FIG. 3 is an illustration of an elementary unit 300 for an example illumination system that uses surface-emitting LEDs as the light sources. In this example, the light source comprises four LED dies 306, or four arrays of LED dies, mounted on a printed circuit board 310. In one or more embodiments, each surface-emitting LED has an étendue of at least 2 $mm^2 \cdot sr$. The radiation emitted by these LED dies is collimated (made more parallel) by four catadioptric lenses 308 comprising both reflective and refractive properties. The collimated light from the catadioptric lenses 308 is then homogenized in the tangential plane by two cylindrical lens arrays 304a and 304b set in tandem to one another. Each of the cylindrical lens arrays 304a and 304b comprises a series of parallel cylindrical lenses arranged in a row that is substantially perpendicular to the optical path of the collimated light from the catadioptric lenses 308. The cylindrical lens arrays 304a and 304b substantially homogenize or normalize the light's power profile to render the irradiance of the beam more uniform across the beam's profile. In some embodiments, the configuration depicted in FIG. 3 can homogenize the illumination of the viewing field to at least 85%. Finally, a cylindrical output lens 302 set perpendicularly to the lens arrays 304a and 304b is used to further collimate the illumination beam in the sagittal plane. That is, the cylindrical output lens 302 is set such that its axis is perpendicular or substantially perpendicular to the axes of the cylindrical lenses comprising the two cylindrical lens arrays 304a and 304b. In some embodiments, the collection efficiency of the elementary unit 300 depicted in FIG. 3 is at least 80%.

FIG. 4 illustrates a top view and a side view of a beam 404 projected by an illumination system 402 comprising elementary unit 300. As shown in this figure, the elementary unit 300 can illuminate a field of view of approximately 4×100 degrees (it is to be understood that "top view" and "side view" designations in FIG. 4 are arbitrary, and that the directions of view depend on the orientation of the illumination system within a given context). As illustrated by the side view of FIG. 4, the linear LED array, the cylindrical lens arrays 304a and 304b, and the cylindrical output lens 302 yield a wide and substantially linear illumination field. Such linear beams are suitable, for example, in scanning-type imaging systems that collect image data by sweeping a light beam across the viewing area in an oscillatory manner to collect line-wise image data, or that project their beams into a viewing field and collect image information for objects or printed symbols that pass through the linear beam. In some embodiments in which the source has a smaller étendue than that of an LED, such as laser, laser array or VCSEL, the angle of vertical (or sagittal) expansion can be substantially smaller than 4 degrees.

Although FIG. 3 depicts elementary unit 300 as comprising surface-emitting LED dies as the light source, some embodiments may use an array of lasers (e.g., a VCSEL array or other laser source) as an alternative to LED dies. Example elementary units that incorporate VCSELs as the light source will be described in more detail below in connection with FIGS. 10-13. In one or more example embodiments, the laser source may have an étendue of approximately $10^{-6}$ $mm^2 \cdot sr$, with a light collection efficiency of almost 100%. In embodiments in which a laser or other point source type is used as the light source, the catadioptric lenses may be replaced by simple collimating lenses. Other types of finite light sources may also be used without departing from the scope of one or more embodiments of this disclosure.

Also, in one or more embodiments, the two lens arrays may be replaced by other means of beam homogenization. For example, a set of aspherical lenses or a set of aspherical surfaces may be used instead of the two lens arrays to homogenize the light beams. In still another embodiment, the homogenization can be accomplished by a light shaping diffuser.

In various embodiments, depending on the requirements of the particular type of imaging system in which elementary unit 300 is used, the light source of elementary unit 300 may be configured to emit a constant beam of light, or may be configured to emit a pulsed or modulated light beam. A pulsed light beam may be appropriate, for example, for use in TOF cameras that measure the distance of an object or surface from the camera based on the time that elapses between transmission of a light pulse and detection of the reflected pulse at the camera (or based on the phase difference between a transmitted pulse and a received pulse). In one or more embodiments, the light source may be modulated by a signal generation component in order to modulate a defined signal onto the light beam (e.g., a continuous tone signal, a pulsed modulation, or other signal). In some such embodiments, the signal generation component may modulate the light beam by modulating the driving current of the light source. Modulating the light emitted by the source using a known signal can allow the reflected light to be recognized and differentiated from ambient light by an image processing application executed by the imaging system.

Figure 5:
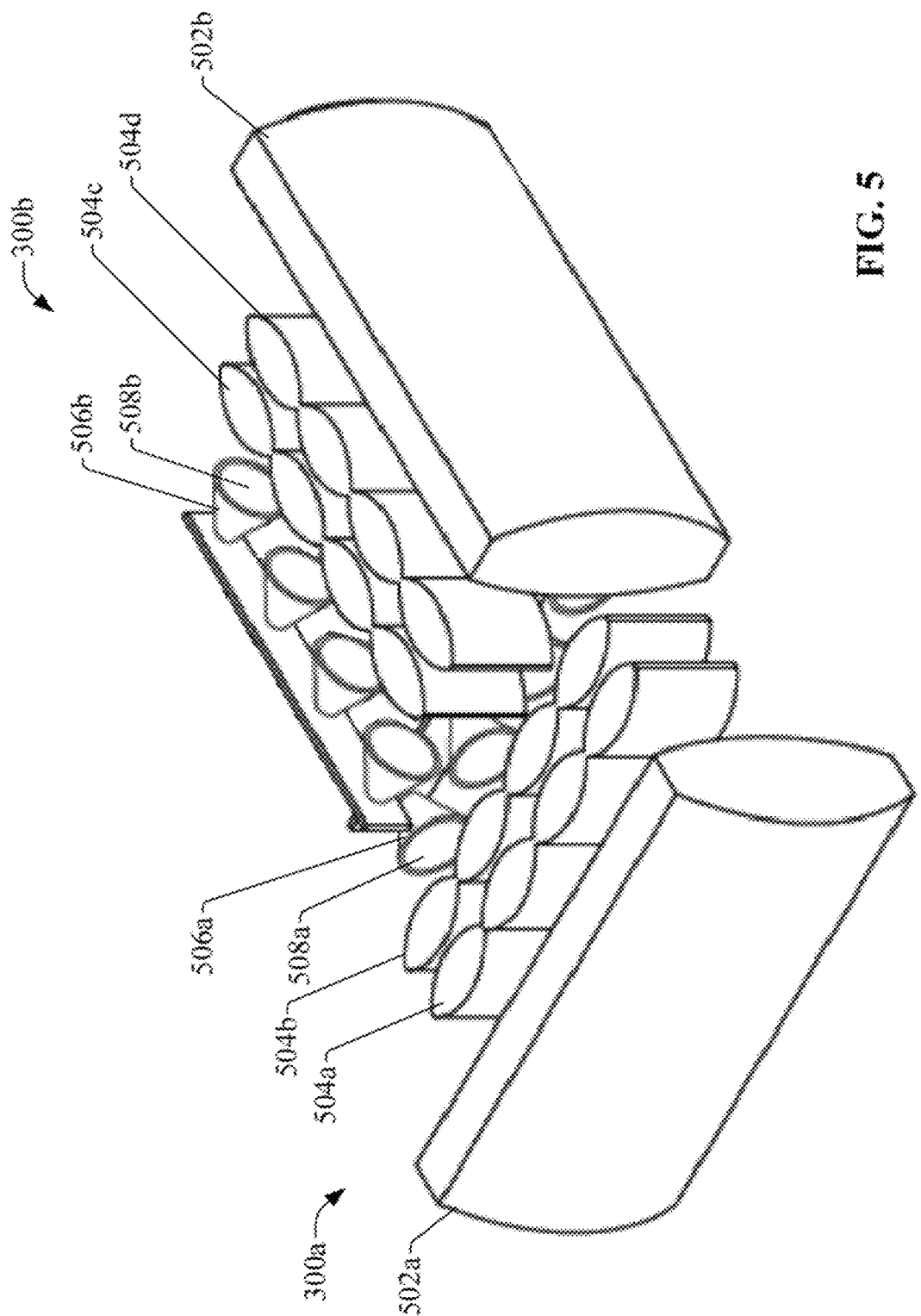
FIG. 5 is a three-dimensional view of an example illumination system comprising two modular elementary units.

In order to further widen the illumination field while maintaining a high level of collection efficiency and homogeneity, additional elementary units can be added to the illumination system in a modular fashion. FIG. 5 depicts another example illumination system comprising two elementary units—elementary unit 300a and elementary unit 300b—similar in configuration to elementary unit 300. In this example, a first elementary unit comprises four LED dies 506a and corresponding catadioptric lenses 508a, two cylindrical lens arrays 504a and 504b set in tandem to one another for homogenizing the collimated light from the catadioptric lenses 508a in the tangential plane, and a cylindrical lens 502a set perpendicularly to the lens arrays 504a and 504b for collimate the light from the lens arrays 504a and 504b in the sagittal plane. Additionally, a similar second elementary unit is abutted to the first elementary unit, oriented at approximately −90 degrees relative to the first elementary unit. The second elementary unit comprises four LED dies 506b, catadioptric lenses 508b, two cylindrical lens arrays 504c and 504d, and a cylindrical lens 502b.

Figure 6:
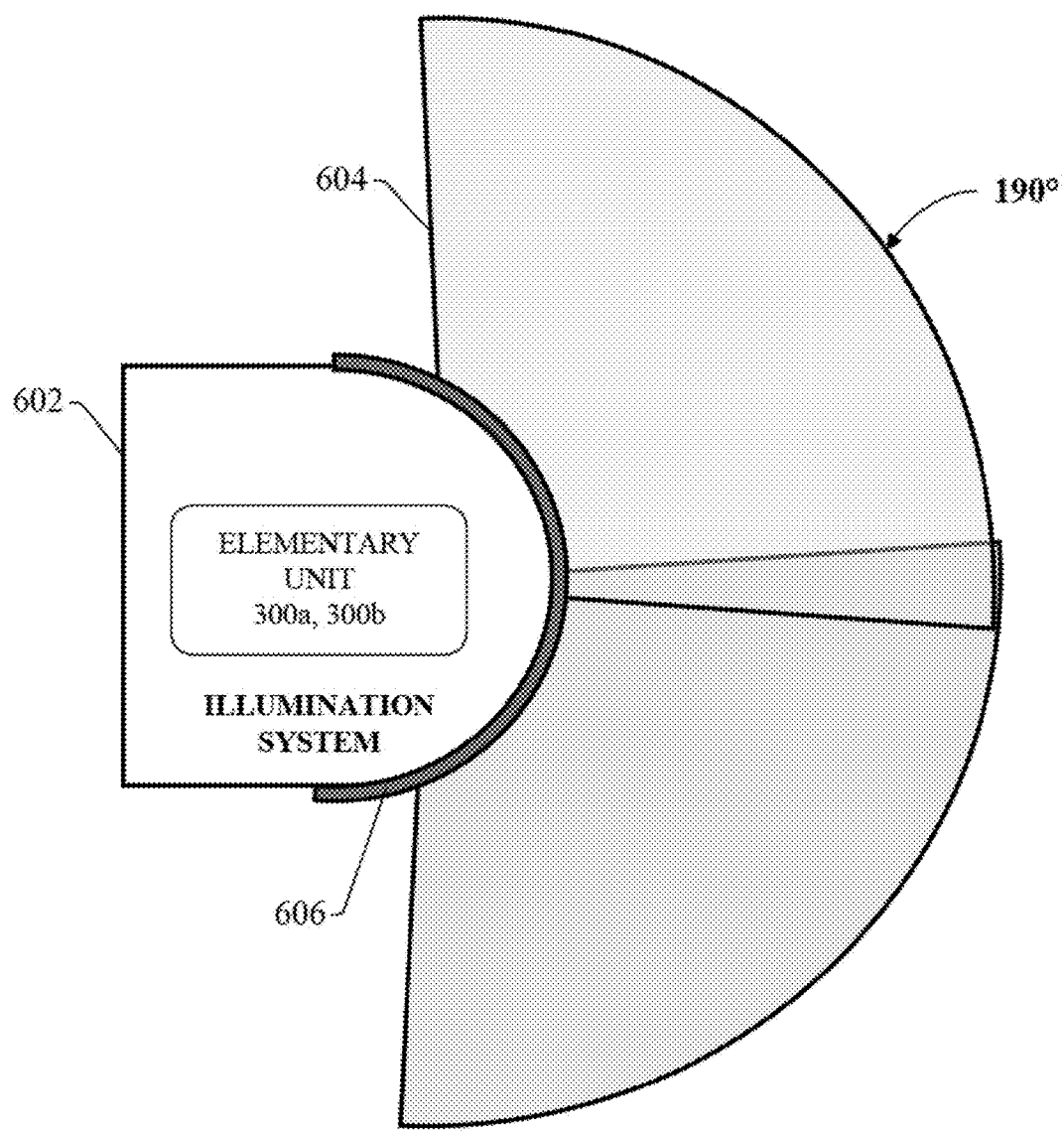
FIG. 6 is a diagram illustrating projection of a combined beam by an illumination system comprising two modular elementary units illuminating a field of view of 190 degrees.

FIG. 6 illustrates projection of a combined beam 604 by an illumination system 602 comprising two elementary units 300a and 300b oriented as shown in FIG. 5. The combined beam comprises the two individual beams (identified by different shadings in FIG. 6) projected by the respective elementary units 300a and 300b through a window 606 of the illumination system 602, yielding a wider illumination field relative to the single elementary unit configuration of FIG. 3 (the side view of the illumination projected by illumination system 602, which is similar to the side view depicted in FIG. 4, is omitted from FIG. 6). By adding the second elementary unit 300b oriented −90 degrees relative to the first elementary unit 300a, the configuration depicted in FIG. 5 can yield an illumination field of approximately 4×190 degrees, as shown in FIG. 6. As in the single elementary unit configuration depicted in FIG. 3, the LED dies can be replaced by another type of light source, such as a laser, without departing from the scope of this disclosure.

Figure 7:
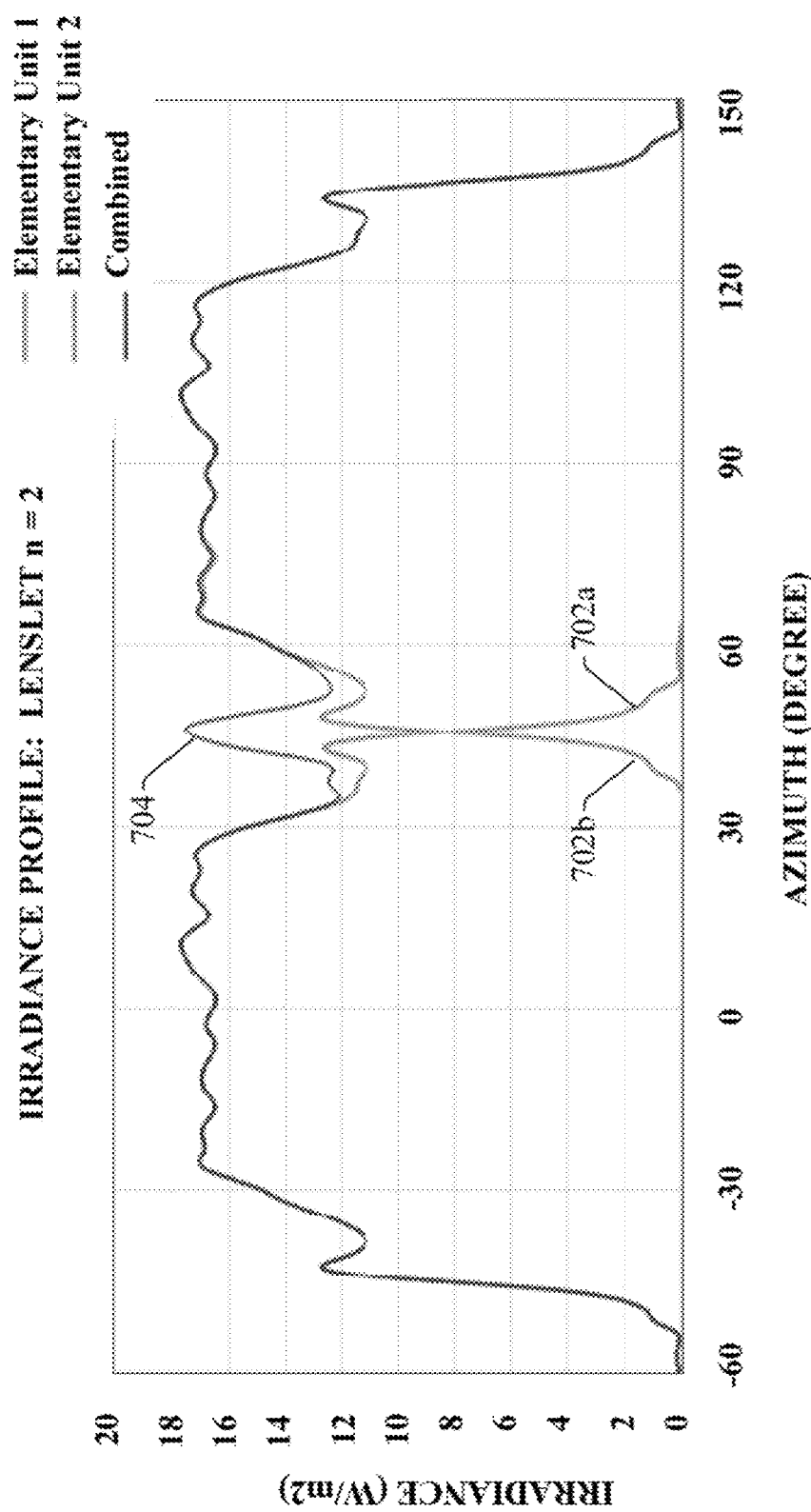
FIG. 7 is a graph plotting the calculated irradiance of an illumination system comprising two modular elementary units at a distance of one meter from the illumination system.

FIG. 7 is a graph plotting the calculated irradiance of the illumination system depicted in FIGS. 5 and 6 at a distance of one meter from the illumination system 602. Using elementary units 300a and 300b, the illumination system exhibits approximately 85% collection efficiency, as well as approximately 85% homogeneity. Line 702a represents the irradiance calculated for elementary unit 1 (covering a first range of the viewing field illuminated by elementary unit 1), while line 702b represents the irradiance calculated for elementary unit 2 (covering a second range of the viewing field illuminated by elementary unit 2). Line 704 represents the combined irradiance calculated for the illumination system 602 across the entire illumination field.

Figure 8:
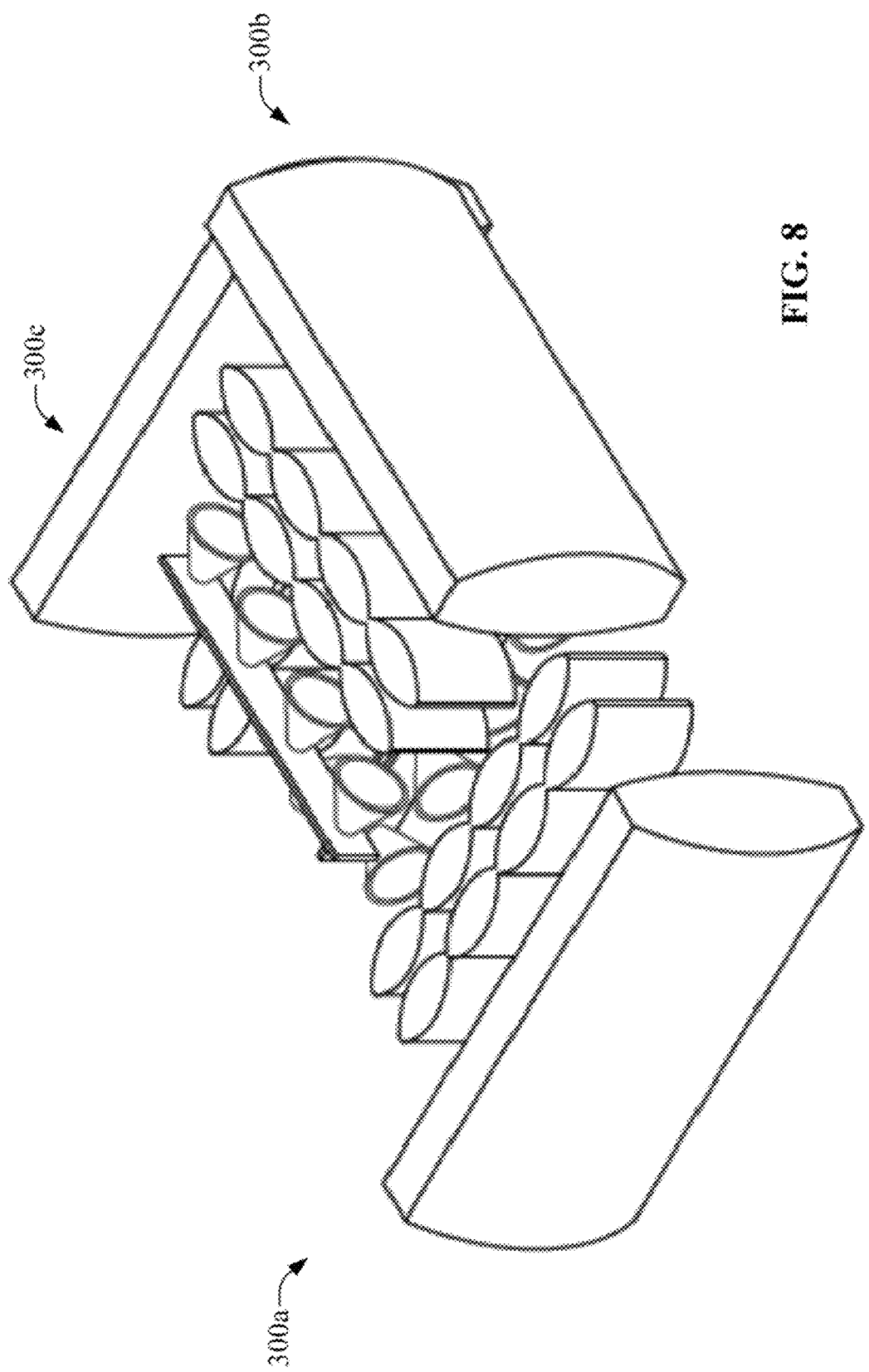
FIG. 8 is a three-dimensional view of an example illumination system comprising three elementary units.
Figure 9:
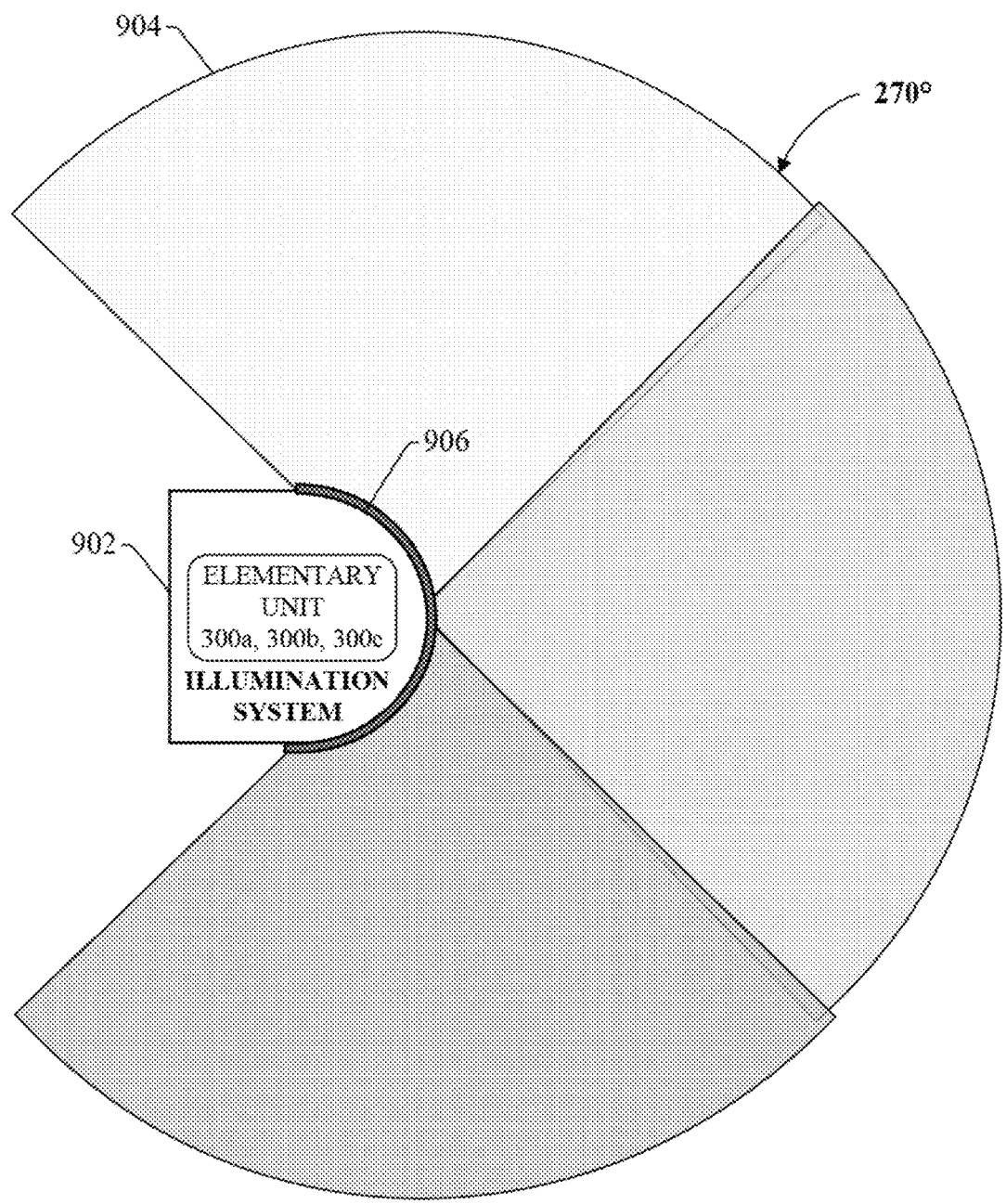
FIG. 9 is a diagram illustrating projection of a combined beam by an illumination system comprising three elementary units illuminating a field of view of 280 degrees.

The illumination field can be further widened by addition of a third elementary unit to the illumination system. FIG. 8 depicts another example illumination system comprising three elementary units 300a, 300b, and 300c, each having a configuration similar to elementary unit 300. The third elementary unit 300c is abutted to the second elementary unit 300b, oriented at −90 degrees relative to the second elementary unit. FIG. 9 illustrates projection of a combined beam 904 by an illumination system 902 comprising the three elementary units 300a, 300b, and 300c oriented as shown in FIG. 8, which project the combined beam through a window 906 of the illumination system 902. This configuration yields an illumination field of approximately 4×270 degrees.

In one or more embodiments, a fourth elementary unit can be added to the first three elementary units 300a, 300b, and 300c in a like manner, oriented −90 degrees relative to the third elementary unit 300c (i.e., 180 degrees relative to the second elementary unit 300b). This configuration yields an illumination field of 4×360 degrees.

The example configurations illustrated in FIGS. 3, 5, and 8 employ linear LED arrays and cylindrical lenses to yield a substantially linear beam having a wide field of view. In some embodiments, the elementary unit(s) can be configured to project an area beam rather than a linear beam. This can be achieved by expanding the array of LED dies 306 from a linear array to an area array—e.g., a two-dimensional array comprising both rows and columns of LEDs—and by replacing the cylindrical lenses of arrays 304a and 304b and cylindrical lens 302 with spherical lenses, thereby extending the sagittal field of illumination. In an example embodiment supporting area beam projection, the source can comprise a 4×4 array of LED dies. The radiation emitted by this area array of LED dies is collimated by a corresponding 4×4 area array of catadioptric lenses, and homogenized in both the sagittal and tangential planes by two spherical lens arrays set in tandem to one another (replacing the cylindrical lens arrays 304a and 304b of FIG. 3). A spherical output lens—replacing cylindrical output lens 302 of FIG. 3—is used to further collimate the illumination beam in both the sagittal and tangential planes. This configuration yields a field of view of approximately 95×95 degrees (compared with the 4×95 field of view produced by the linear configuration of FIG. 3).

As with the linear elementary units described above, the width of the area beam produced by the area elementary unit can be widened by adding additional elementary units. For example, in accordance with a dual-unit embodiment, abutting two area elementary units together oriented at 90 degrees relative to one another (similar to the arrangement of linear elementary units depicted in FIG. 5) can yield an illumination field of approximately 95×190 degrees. In another example, a three-unit embodiment can comprise three area elementary units abutted together, each unit oriented at 90 degrees relative to an adjacent unit (similar to the arrangement of linear elementary units depicted in FIG. 8). This three-unit configuration can yield an illumination field of approximately 95×270 degrees. In yet another example, a full 95×360 degree illumination field can be projected using a four-unit embodiment comprising four area elementary units abutted to one another, with each elementary unit oriented at 90 degrees relative to an adjacent elementary unit.

Figure 10A:
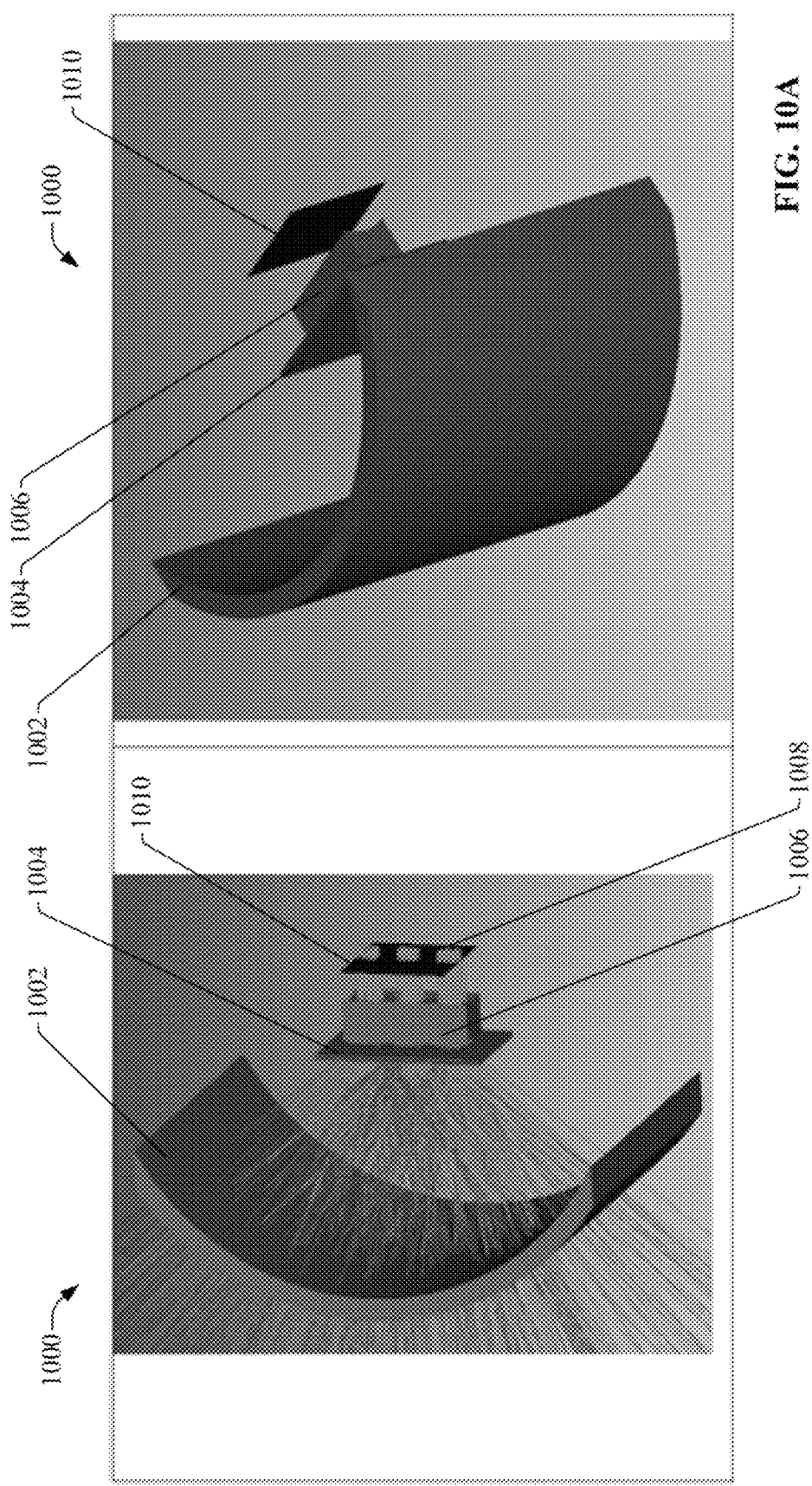
FIG. 10A depicts two three-dimensional views of an elementary unit for an example illumination system that uses VCSELs as the light sources.

As noted above, some embodiments described herein can use VCSELs as light sources, rather than the LED arrays depicted in FIGS. 3, 5, and 8. FIG. 10A depicts two three-dimensional views of an elementary unit 1000 for an example illumination system that uses VCSELs as the light sources. In this example, the light source comprises three VCSEL dies 1008 mounted on a printed circuit board 1010. In one or more embodiments, each surface-emitting VCSEL has an &endue of typically 0.1 mm$^2$·sr. Radiation emitted by the VCSELs is collimated in the tangential plane and expanded in the sagittal plane by three biconic lenses 1006. The radiation is then diffused by a light shaping diffuser 1004, attributing the radiation an azimuthal expanse of approximately 100 degrees, while homogenizing the beam irradiance. In some embodiments, the configuration depicted in FIG. 10A can homogenize the illumination of the viewing field to at least 85%. Finally, a cylindrical output lens 1002 set perpendicularly to the VCSEL arrays 1008 is used to collimate the illumination beam in the sagittal plane. In some embodiments, the transmission efficiency of the elementary unit 1000 depicted in FIG. 10A is at least 80%.

Figure 10B:
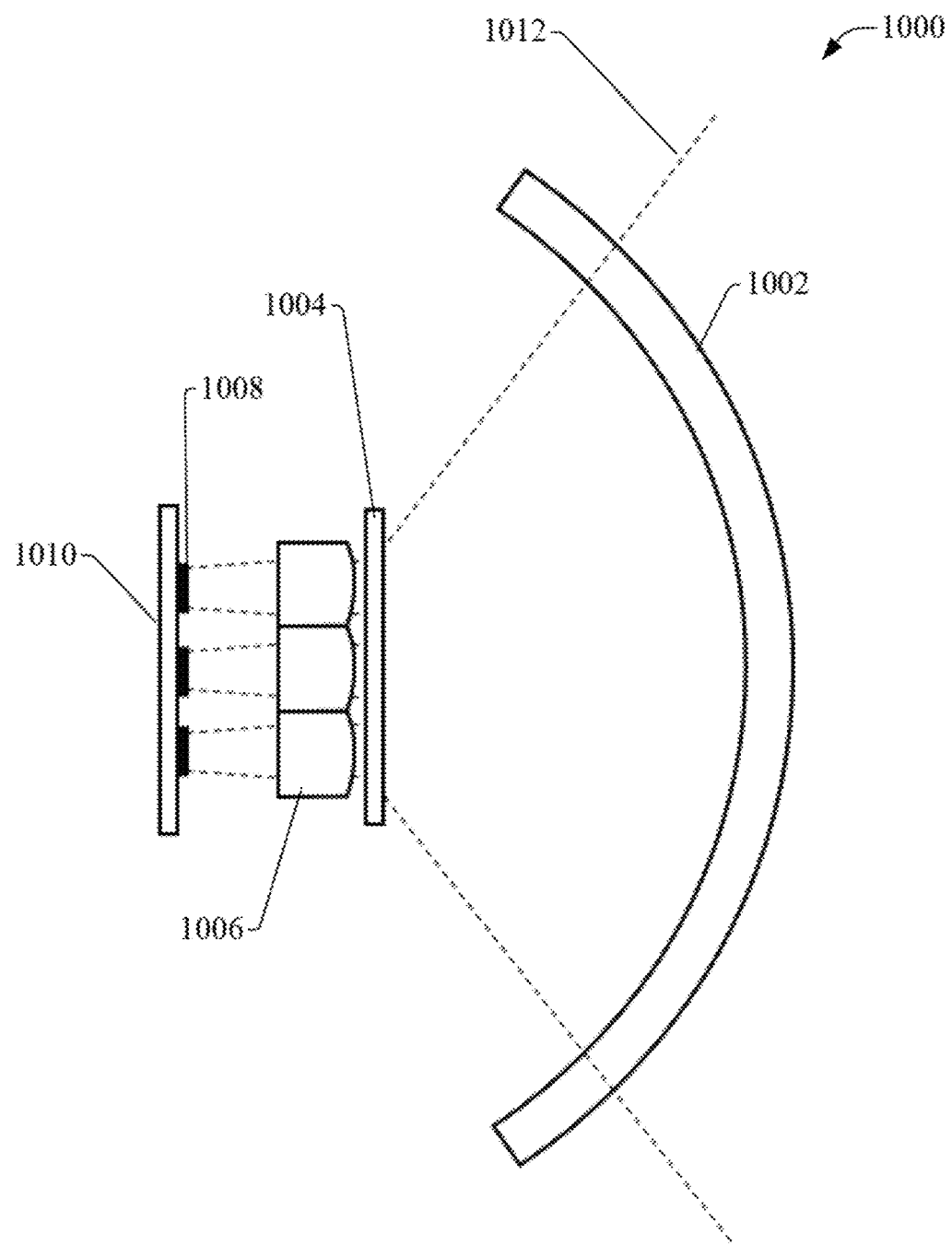
FIG. 10B is a top view of an elementary unit for an example illumination system that uses VCSELs as the light sources.

A top view of the elementary unit 1000 is shown in FIG. 10B. As shown in this view, VCSELs 1008 are mounted on a printed circuit board (PCB) 1010. In this example, radiation emitted by the VCSELs 1008 and represented by the rays 1012 is collimated in the tangential plane and expanded in the sagittal plane by three biconic lenses 1006. The radiation is then diffused by a light shaping diffuser 1004, attributing the radiation an azimuthal expanse of approximately 100 degrees, while homogenizing the beam irradiance. The cylindrical Fresnel output lens 1002 is bent and set perpendicularly to the VCSEL arrays 1008. Lens 1002 has no power in the tangential plane and is used to collimate the illumination beam in the sagittal plane. A side view of elementary unit 1000 is shown in FIG. 10C.

Figure 11A:
FIG. 11A is a profile view of an example Fresnel lens.
Figure 11B:
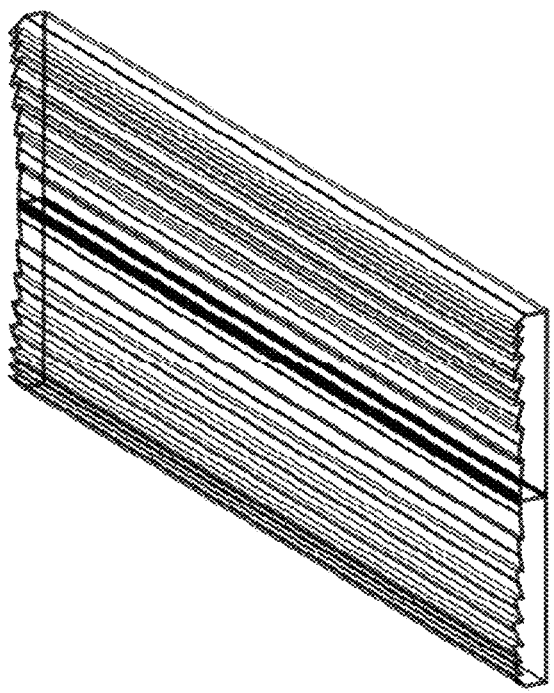
FIG. 11B is a view of an example cylindrical Fresnel lens.
Figure 11C:
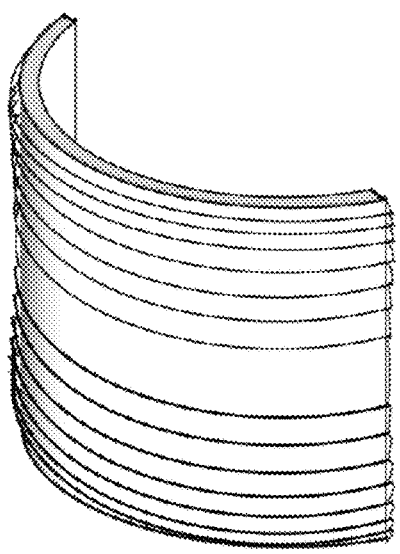
FIG. 11C is a view of an example bent cylindrical Fresnel lens.

An advantage of the Fresnel lens 1002 is that it is thin and can be mass produced at low cost. Fresnel lens 1002 can be made of an optical polymer, allowing the lens 1002 be bent as shown in FIGS. 10A-10C. FIG. 11A illustrates a profile view of an example Fresnel lens. FIG. 11B illustrates a cylindrical Fresnel lens. FIG. 11C illustrates a bent cylindrical Fresnel lens.

Figure 12A:
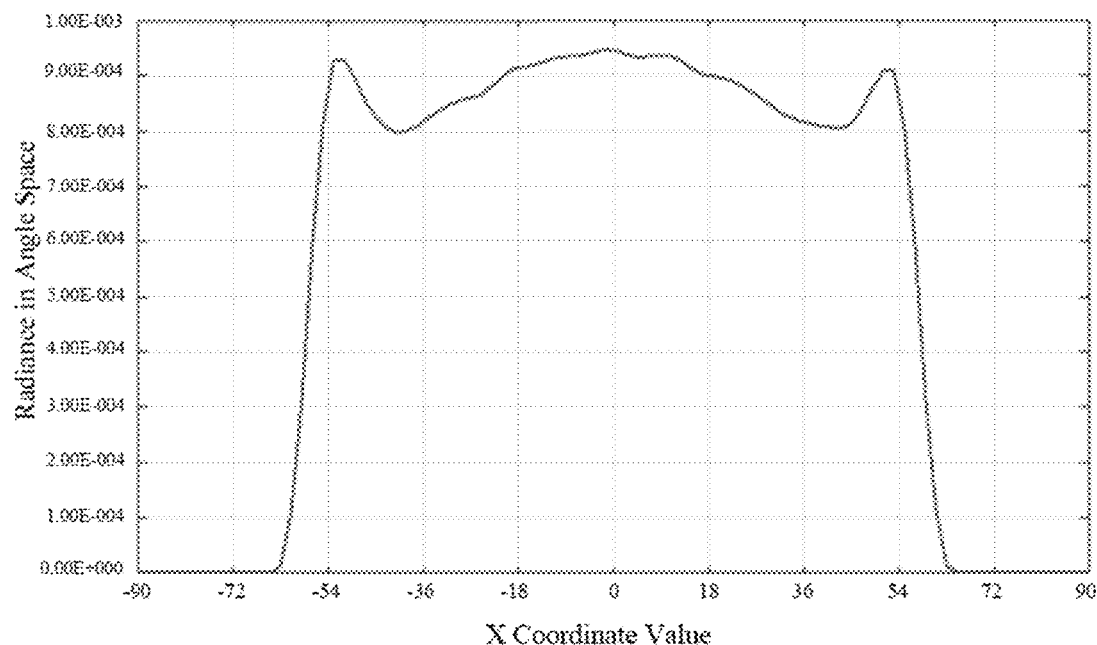
FIG. 12A is a plot of radiance calculated in the tangential angular space spanning an angle of 110 degrees for an example illumination system that uses VCSELs at a distance of five meters from the illumination system.
Figure 12B:
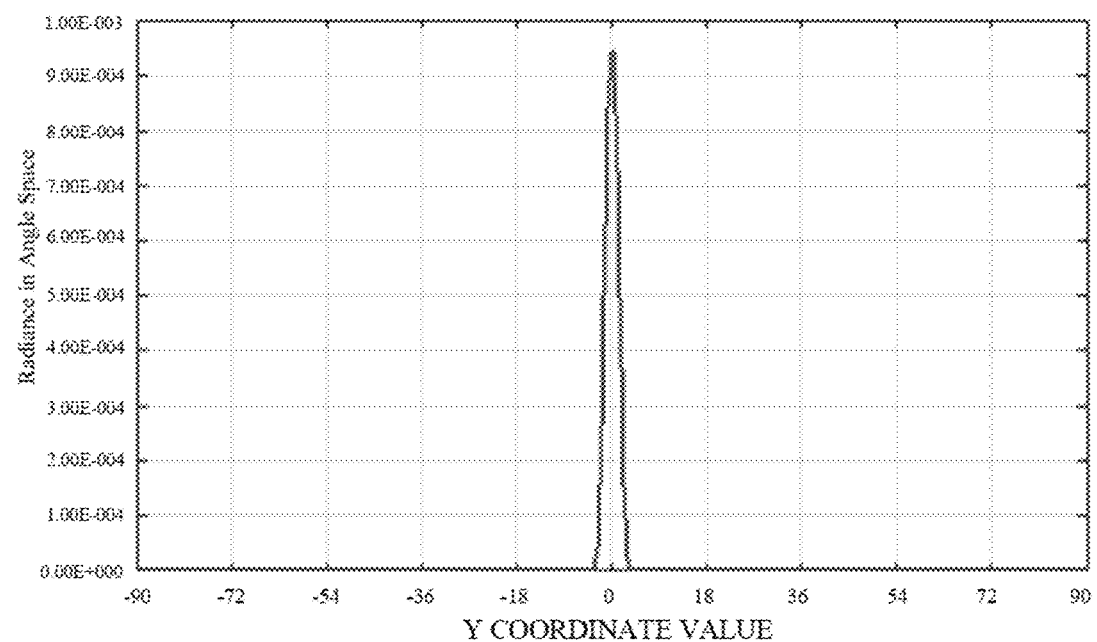
FIG. 12B is a plot of radiance calculated in the sagittal angular space spanning an angle of 2.5 degrees for an example illumination system that uses VCSELs at a distance of five meters from the illumination system.

FIGS. 12A and 12B are plots of the calculated radiance in angular space of the illumination system using VCSELs depicted in FIGS. 10A-10C at a distance of five meters from the illumination system. The illumination system exhibits approximately over 80% transmission efficiency, as well as approximately 85% homogeneity. FIG. 12A represents the radiance calculated in the tangential angular space spanning an angle of 100 degrees (within the magnitude of 85%), while FIG. 12B represents the radiance calculated in the sagittal angular space spanning an angle of 2.5 degrees (within full width at half maximum, or FWHM).

To further widen the illumination field while maintaining a high level of collection and transmission efficiencies as well as homogeneity, additional elementary units using VCSELs can be combined in a modular fashion, similar to the LED-based elementary units described above. For example, to a first elementary unit comprising three VCSELs 1008 (as shown in FIG. 10B), corresponding biconic lenses 1006, a light shaping diffuser 1004, and a cylindrical lens 1002, a second similar unit can be abutted at an azimuthal angle of approximately 90 degrees. The resulting combined illumination system radiates to an angular space of approximately 2×190 degrees. Additionally, the two elemental units may radiate at a like wavelength in some embodiments, or at dissimilar wavelengths in other embodiments. Also, two elementary units may radiate unpolarized light in some embodiments, or polarized light at similar state of polarization in other embodiments, or polarized light at dissimilar state of polarization in yet other embodiments.

Figure 13:
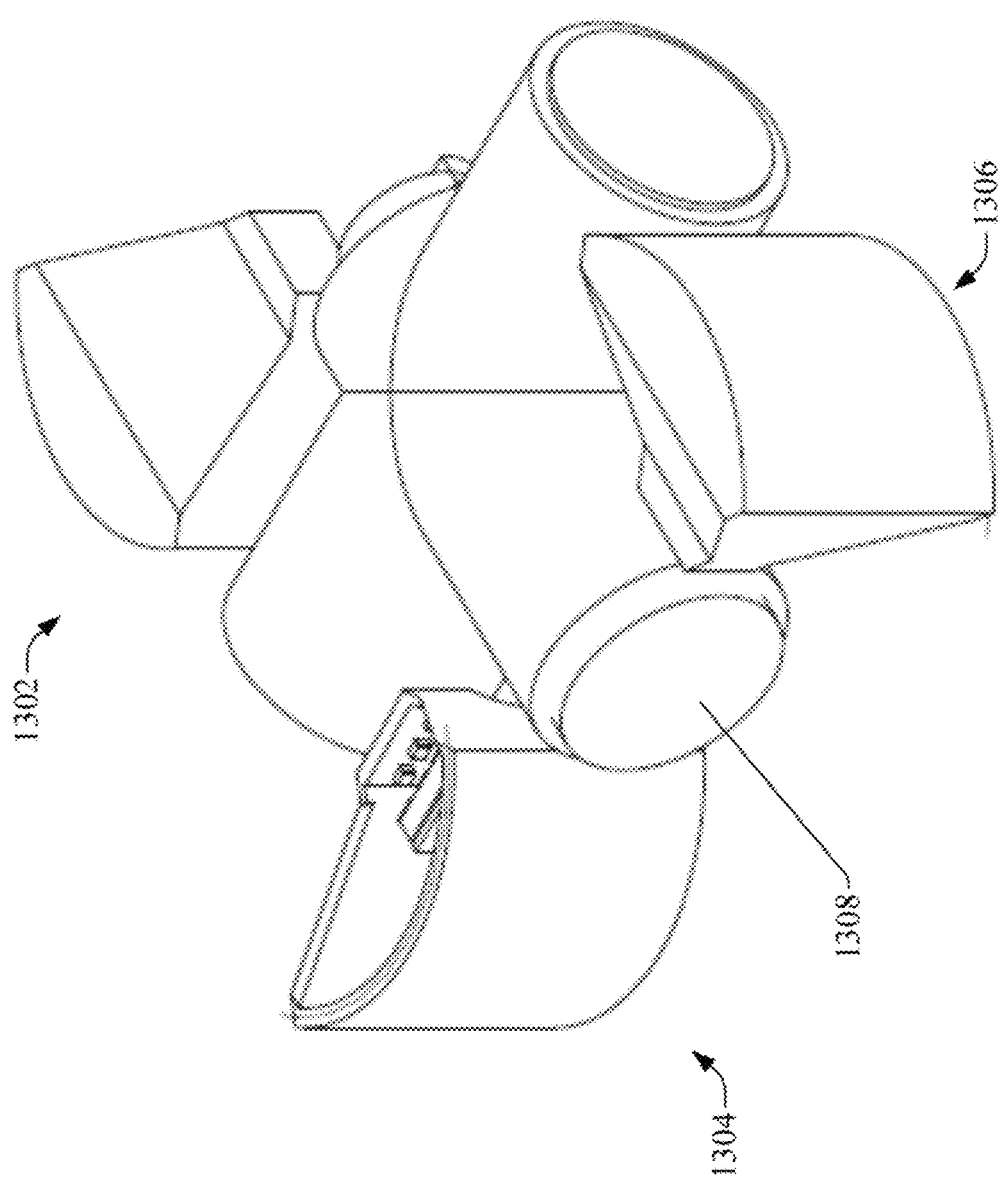
FIG. 13 is a three-dimensional view depicting three elementary units that are combined forming an illumination system that radiates to an angular space of approximately 2×280 degrees.

To still further widen the illumination field while maintaining a high level of collection and transmission efficiencies as well as homogeneity, three elementary units using VCSELs can be combined in a modular fashion. FIG. 13 is a three-dimensional view depicting three elementary units 1302, 1304, and 1306 that are combined forming an illumination system that radiates to an angular space of approximately 2×280 degrees. The three elementary units may radiate at a like wavelength in some embodiments, or at dissimilar wavelengths in other embodiments. Also, the elementary units may radiate unpolarized light in some embodiments, or polarized light at similar state of polarization in other embodiments, or polarized light at dissimilar state of polarization in yet other embodiments. Note that FIG. 13 depicts the elementary units 1302, 1304, and 1306 in conjunction with an imaging lens 858.

The example configurations illustrated in FIGS. 10A-10C and 13 employ VCSELs and cylindrical lenses to yield a substantially linear beam having a wide field of view. In some embodiments, the elementary unit(s) can be configured to project an area beam rather than a linear beam. This can be achieved by expanding the array of VCSELs 1008 from a linear array to an area array—e.g., a two-dimensional array comprising both rows and columns of VCSELs, noting that each VCSEL is an array in and of itself—and by replacing the biconic lenses of 1006 and cylindrical lens 1002 with spherical lenses, thereby extending the sagittal field of illumination. In an example embodiment supporting area beam projection, the source can comprise a 4×4 array of VCSELs. Radiation emitted by the VCSELs is collimated by corresponding 4×4 array of lenses, and homogenized by a light shaping diffuser. A spherical output lens—replacing cylindrical output lens 1002 of FIG. 10A—is used to further collimate the illumination beam in both the sagittal and tangential planes. This configuration yields a field of view of approximately 100×100 degrees (compared with the 2×100 field of view produced by the linear configuration of FIG. 10A).

As with the linear elementary units described above, the width of the area beam produced by the area elementary unit can be widened by adding additional elementary units. For example, in accordance with a dual-unit embodiment, abutting two area elementary units together oriented at approximately 90 degrees relative to one another can yield an illumination field of approximately 100×190 degrees. In another example, a three-unit embodiment can comprise three area elementary units abutted together, each unit oriented at approximately 90 degrees relative to an adjacent unit (similar to the arrangement of linear elementary units depicted in FIG. 13). This three-unit configuration can yield an illumination field of approximately 100×280 degrees. In yet another example, a full 100×360 degree illumination field can be projected using a four-unit embodiment comprising four area elementary units abutted to one another, with each elementary unit oriented at approximately 90 degrees relative to an adjacent elementary unit.

FIGS. 14-18 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

Figure 14:
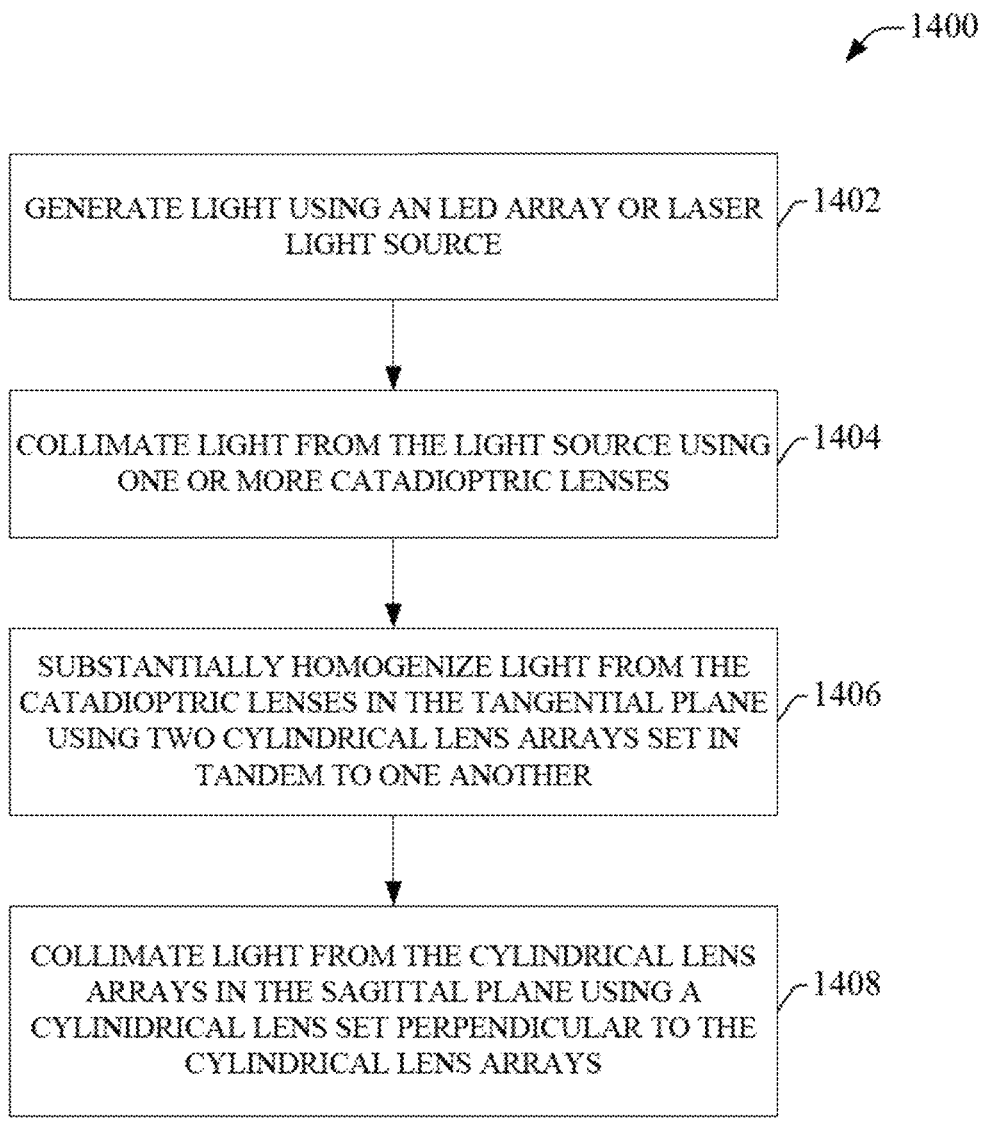
FIG. 14 is a flowchart of an example methodology for generating a highly homogenized linear beam of light having a wide illumination field while maintaining a high collection efficiency.

FIG. 14 illustrates an example methodology 1400 for generating a highly homogenized linear beam of light (e.g., in connection with illuminating a field of view to facilitate accurate collection of image data by an imaging system) having a wide illumination field while maintaining a high collection efficiency. Initially, at 1402, light is generated using an LED array or laser light source. The light source may comprise, for example, a linear array of LED dies or laser light sources. At 1404, light generated at step 1404 is collimated using one or more catadioptric lenses. For embodiments in which the light source comprises an array of LED dies, a catadioptric lens can be associated with each LED to collect and collimate the light generated by that LED.

At 1406, light from the catadioptric lenses is substantially homogenized in the tangential plane using two cylindrical lens arrays set in tandem to one another. At 1408, light from the cylindrical lens arrays is collimated in the sagittal plane using a cylindrical lens set perpendicular to the cylindrical lens arrays.

Figure 15:
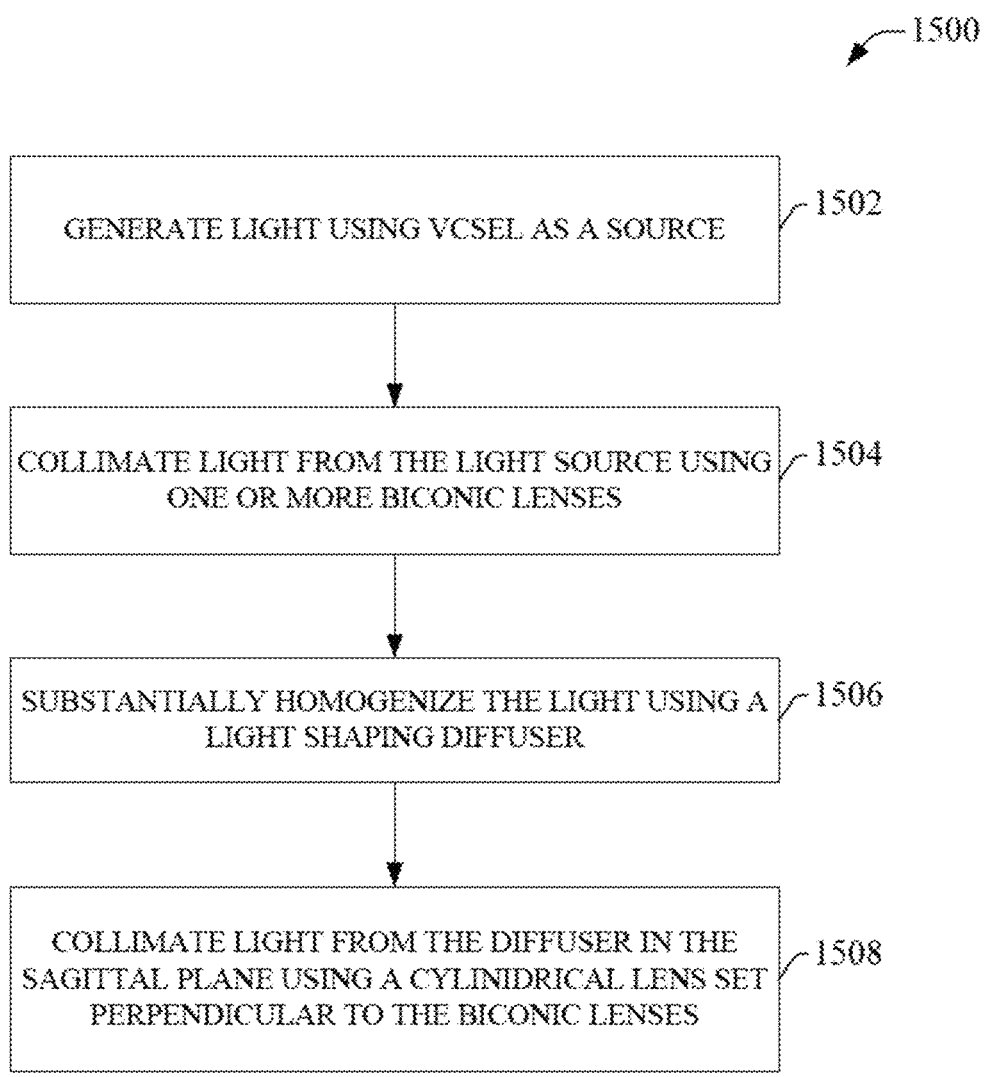
FIG. 15 is a flowchart of an example methodology for generating a highly homogenized linear beam of light having a wide illumination field while maintaining a high collection efficiency using VCSELs as a source of the illumination.

FIG. 15 illustrates an example methodology 1500 for generating a highly homogenized linear beam of light (e.g., in connection with illuminating a field of view to facilitate accurate collection of image data by an imaging system) having a wide illumination field while maintaining a high collection efficiency using VCSELs as a source of the illumination. Initially, at 1502, light is generated using VCSELs. At 1504, light generated at step 1502 is collimated using one or more biconic lenses. At 1506, light from the biconic lenses is substantially homogenized in the tangential plane using a light shaping diffuser. At 1508, light from the biconic lens arrays is collimated in the sagittal plane using a cylindrical lens set perpendicular to the biconic lens arrays.

Figure 16:
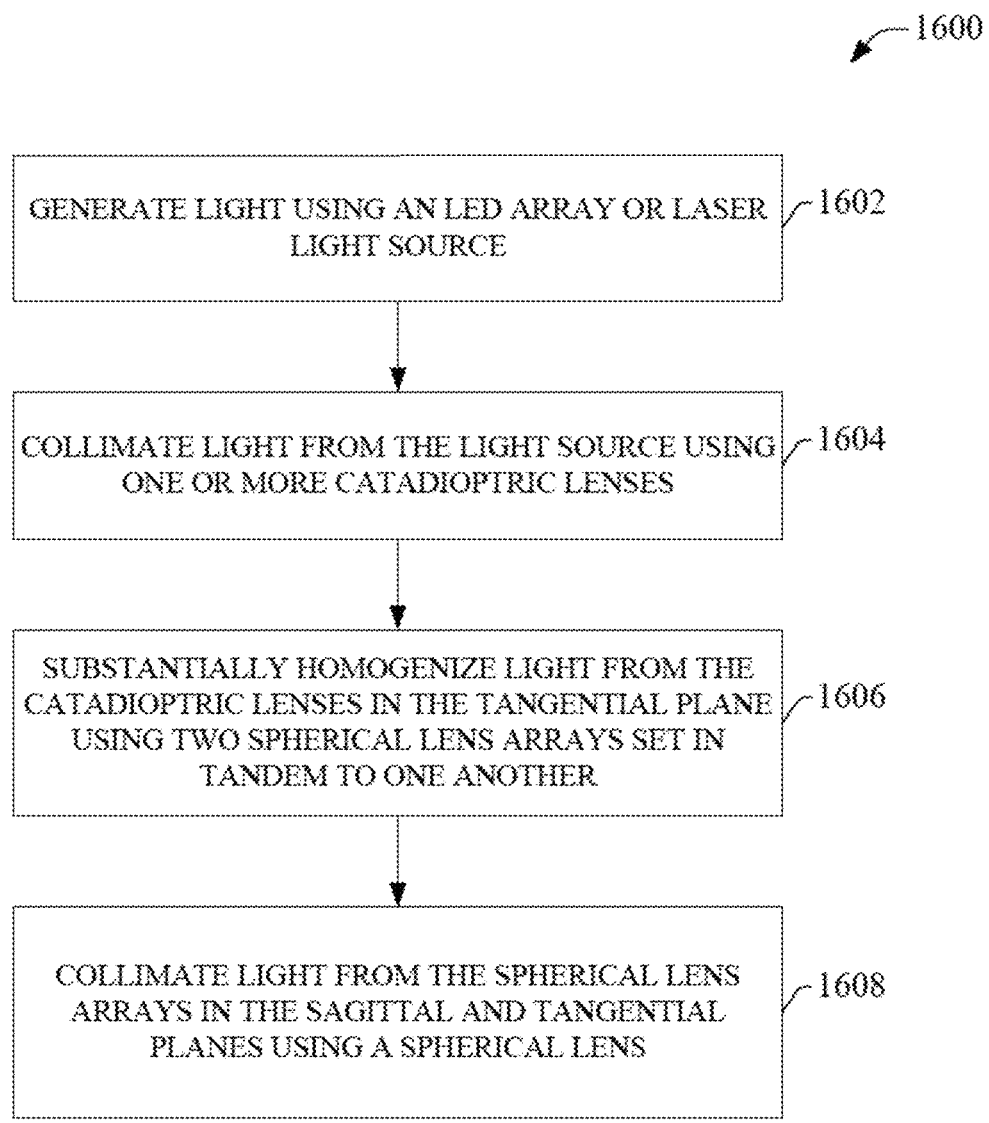
FIG. 16 is a flowchart of an example methodology for generating a highly homogenized area beam of light having a wide illumination field while maintaining a high collection efficiency.

FIG. 16 illustrates an example methodology 1600 for generating a highly homogenized area beam of light (e.g., in connection with illuminating a field of view to facilitate accurate collection of image data by an imaging system)

having a wide illumination field while maintaining a high collection efficiency. Initially, at 1602, light is generated using an LED array, VCSELs, or laser light source. The light source may comprise, for example, a two-dimensional array of LED dies. At 1604, light generated at step 1604 is collimated using one or more catadioptric lenses (or biconic lenses in embodiments using VCSELs). For embodiments in which the light source comprises an array of LED dies, a catadioptric lens can be associated with each LED to collect and collimate the light generated by that LED.

At 1606, light from the catadioptric lenses is substantially homogenized in the tangential plane using two spherical lens arrays set in tandem to one another. At 1608, light from the spherical lens arrays is collimated in the sagittal and tangential planes using a spherical lens. In embodiments that use VCSELs at step 1606, light from the biconic lenses is substantially homogenized using a light shaping diffuser. Subsequently at 1608, the light is collimated in the sagittal and tangential planes using a spherical lens.

Figure 17:
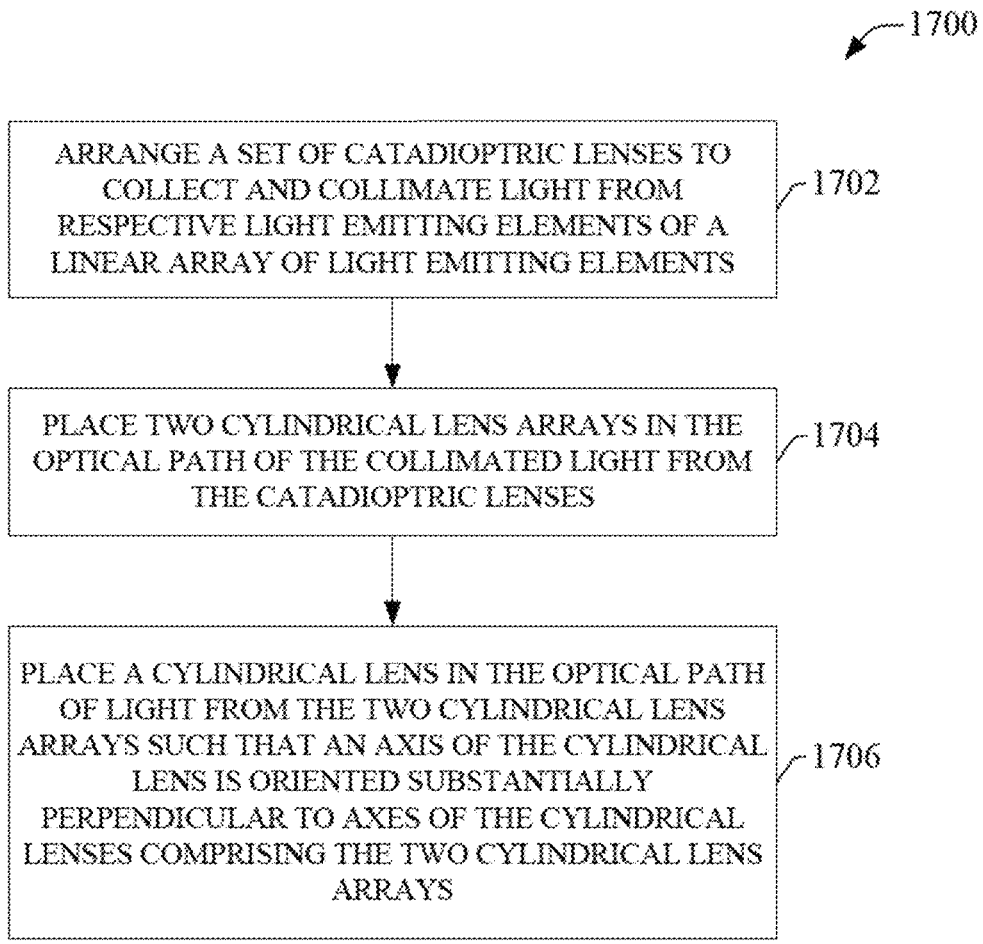
FIG. 17 is a flowchart of an example methodology for manufacturing a modular illumination system capable of projecting a linear light beam having a wide field of view and a high level of homogenization across the beam's irradiance profile.

FIG. 17 illustrates an example methodology 1700 for manufacturing a modular illumination system capable of projecting a linear light beam having a wide field of view and a high level of homogenization across the beam's irradiance profile. Initially, at 1702, a set of catadioptric lenses (or biconic lenses in some embodiments) are arranged to collect and collimate light from respective light emitting elements of a linear array of light emitting elements. The light emitting elements may comprise, for example, LEDs of a linear LED die array, VCSELs, or a laser-based light source. At 1704, two cylindrical lens arrays are placed in the optical path of the collimated light from the catadioptric lenses. Each of the cylindrical lens arrays comprises a set of parallel cylindrical lenses placed in a row that is substantially perpendicular to the optical path of the collimated light that radiates from the catadioptric lenses. In embodiments using VCSELs, the cylindrical lens arrays at 1704 can be replaced by a light shaping diffuser. At 1706, a cylindrical lens is placed in the optical path of light from the two cylindrical lens arrays such that the axis of the cylindrical lens is oriented substantially perpendicular to the axes of the cylindrical lenses comprising the two cylindrical lens arrays (or biconic lenses in some embodiments).

Figure 18:
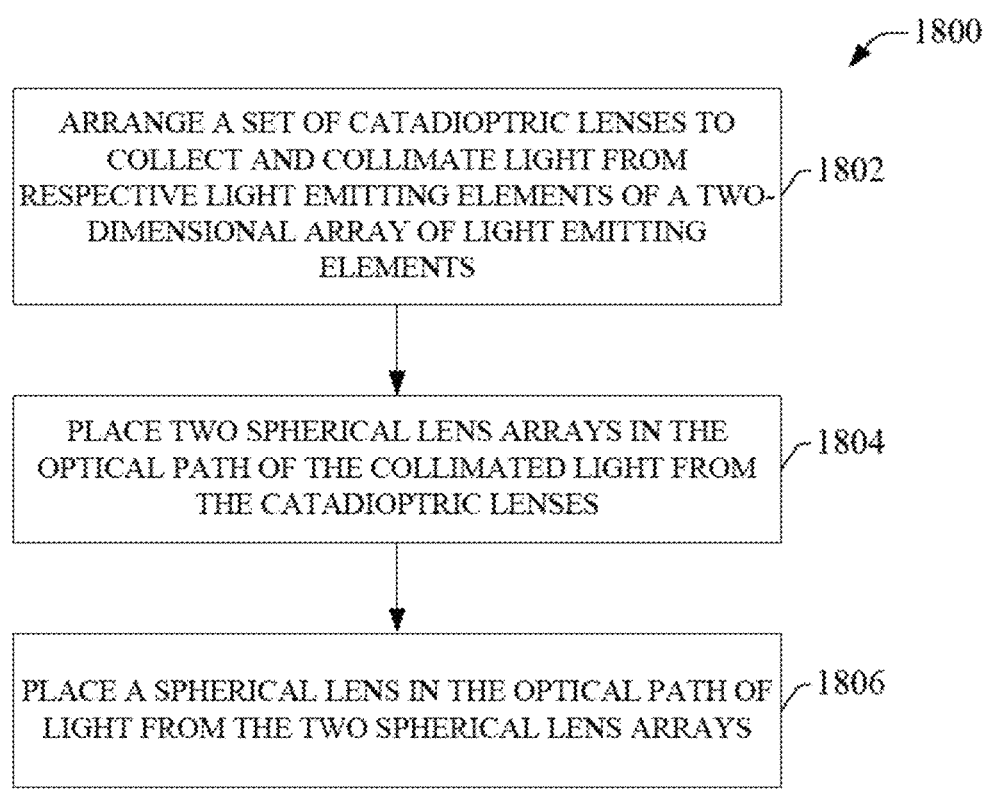
FIG. 18 is a flowchart of an example methodology for manufacturing a modular illumination system capable of projecting an area light beam having a wide field of view and a high level of homogenization across the beam's irradiance profile.

FIG. 18 illustrates an example methodology 1800 for manufacturing an a modular illumination system capable of projecting an area light beam having a wide field of view and a high level of homogenization across the beam's irradiance profile. Initially, at 1802, a set of catadioptric lenses (or biconic lenses in some embodiments) are arranged to collect and collimate light from respective light emitting elements of a two-dimensional array of light emitting elements. The light emitting elements may comprise, for example, LEDs of a two-dimensional LED die array, VCSELs, or laser-based light sources. At 1804, two spherical lens arrays are placed in the optical path of the collimated light that radiates from the catadioptric lenses (or biconic lenses in some embodiments). Each of the spherical lens arrays comprises a set of spherical lenses placed in a row that is substantially perpendicular to the optical path of the collimated light from the catadioptric lenses (or biconic lenses in some embodiments). At 1806, a spherical lens is placed in the optical path of light that radiates from the two spherical lens arrays.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims. For instance, all the lenses described above may be either refractive lenses, refractive Fresnel lenses, binary lenses, diffractive lenses, holographic optical elements or a combination of such lenses.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. An illumination system, comprising:
   an array of light sources;
   one or more catadioptric lenses arranged to collect light from the array of light sources;
   a first array of lenses arranged in a first row that is substantially perpendicular to an optical path of light from the one or more catadioptric lenses;
   a second array of lenses arranged in a second row that is substantially parallel to the first row and substantially perpendicular to the optical path; and
   an output lens arranged to collect and project light from the second array of lenses to yield an output beam.

2. The illumination system of claim 1, wherein the array of light sources comprises at least one of a linear array of light emitting diodes, a laser array, or a vertical-cavity surface-emitting laser (VCSEL) array.

3. The illumination system of claim 2, wherein the first array and the second array comprise cylindrical lenses oriented substantially parallel with one another.

4. The illumination system of claim 3, wherein the output lens comprises a cylindrical output lens.

5. The illumination system of claim 4, wherein an axis of the cylindrical output lens is substantially perpendicular to axes of the cylindrical lenses of the first and second arrays.

6. The illumination system of claim 5, wherein the cylindrical output lens is configured to collimate the light from the second array of lenses in a sagittal plane to yield a collimated light beam.

7. The illumination system of claim 1, wherein the first array and the second array comprise spherical lenses, and the output lens comprises a spherical lens.

8. The illumination system of claim 1, further comprising a modulation component configured to modulate the light from the array of light sources.

9. The illumination system of claim 1, wherein the array of light sources comprises a first array of light sources, the one or more catadioptric lenses comprise one or more first catadioptric lenses, the output lens comprises a first output lens, and the optical path comprises a first optical path, and the illumination system further comprises:
    a second array of light sources oriented substantially ninety degrees relative to the first array of light sources;
    one or more second catadioptric lenses arranged to collect light from the second array of light sources;
    a third array of lenses arranged in a third row that is substantially perpendicular to a second optical path of light from the one or more second catadioptric lenses;
    a fourth array of lenses arranged in a fourth row that is substantially parallel to the third row and substantially perpendicular to the second optical path; and
    a second output lens arranged to collect light from the fourth array of lenses.

10. The illumination system of claim 9, wherein the first array of light sources and the second array of light sources are configured to emit light of respective different wavelengths or to emit light of a same wavelength.

11. The illumination system of claim 9, wherein the first array of light sources is configured to emit S-polarized light and the second array of light sources is configured to emit P-polarized light.

12. The illumination system of claim 9, further comprising:
    a third array of light sources oriented substantially ninety degrees relative to the second array of light sources;
    one or more third catadioptric lenses arranged to collect light from the third array of light sources;
    a fifth array of lenses arranged in a fifth row that is substantially perpendicular to a third optical path of light from the one or more third catadioptric lenses;
    a sixth array of lenses arranged in a sixth row that is substantially parallel to the fifth row and substantially perpendicular to the third optical path; and
    a third output lens arranged to collect light from the sixth array of lenses.

13. The illumination system of claim 12, further comprising:
    a fourth array of light sources oriented substantially ninety degrees relative to the third array of light sources;
    one or more fourth catadioptric lenses arranged to collect light from the fourth array of light sources;
    a seventh array of lenses arranged in a seventh row that is substantially perpendicular to a fourth optical path of light from the one or more fourth catadioptric lenses;
    an eighth array of lenses arranged in an eight row that is substantially parallel to the seventh row and substantially perpendicular to the fourth optical path; and
    a fourth output lens arranged to collect light from the eighth array of lenses.

14. The illumination system of claim 1, wherein the illumination system is an integrated component of a time-of-flight camera.

15. A method for producing a beam of light, comprising:
    generating light by a linear array of light sources;
    collimating the light by one or more catadioptric lenses to yield first collimated light;
    homogenizing the first collimated light in a tangential plane by two cylindrical lens arrays set in tandem to one another to yield homogenized light; and
    collimating the homogenized light in a sagittal plane by a cylindrical lens set perpendicular to the two cylindrical lens arrays to yield second collimated light.

16. The method of claim 15, wherein the generating comprises generating the light by at least one of an array of light emitting diode dies, a laser array, or a vertical-cavity surface-emitting laser (VCSEL) array.

17. The method of claim 15, wherein the generating comprises at least one of modulating the light or generating a pulsed light beam.

18. A method for producing a beam of light, comprising, generating light by an array of light sources;
    collimating the light in a tangential plane and expanding the light in a sagittal plane by one or more lenses to yield first collimated light;
    diffusing and homogenizing the first collimated light to yield homogenized light; and
    collimating the homogenized light in the tangential plane and a sagittal plane by a cylindrical lens.

19. The method of claim 18, wherein the generating comprises generating the light by a vertical-cavity surface-emitting laser (VCSEL) array.

20. The method of claim 19, wherein:
    the collimating the light comprises collimating the light using three biconic lenses,
    the diffusing and homogenizing comprises diffusing and homogenizing the first collimated light using a diffuser, and
    the collimating the homogenized light comprises collimating the homogenized light using a Fresnel lens.

* * * * *